United States Patent
Tsuneta et al.

(10) Patent No.: US 6,838,667 B2
(45) Date of Patent: Jan. 4, 2005

(54) METHOD AND APPARATUS FOR CHARGED PARTICLE BEAM MICROSCOPY

(75) Inventors: Ruriko Tsuneta, Fuchu (JP); Masanari Koguchi, Kunitachi (JP); Mari Nozoe, Hino (JP); Muneyuki Fukuda, Kokubunji (JP); Mitsugu Sato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/983,898

(22) Filed: Oct. 26, 2001

(65) Prior Publication Data

US 2002/0056808 A1 May 16, 2002

(30) Foreign Application Priority Data

Oct. 27, 2000 (JP) ........................................ 2000-333534

(51) Int. Cl.⁷ .......................................... G01N 23/225
(52) U.S. Cl. ...................................... 250/306; 356/401
(58) Field of Search ........................... 250/306, 559.27, 250/311

(56) References Cited

U.S. PATENT DOCUMENTS

| | | | | |
|---|---|---|---|---|
| 4,789,833 A | * | 12/1988 | Nishimura | 324/320 |
| 5,144,129 A | * | 9/1992 | Kobayashi et al. | 250/307 |
| 5,502,384 A | * | 3/1996 | Nakaya et al. | 324/309 |
| 6,333,510 B1 | * | 12/2001 | Watanabe et al. | 250/559.27 |
| 6,365,425 B1 | * | 4/2002 | Ikota et al. | 438/16 |
| 6,369,891 B1 | * | 4/2002 | Kane et al. | 356/401 |
| 6,448,555 B1 | * | 9/2002 | Hosokawa | 250/310 |
| 6,570,156 B1 | * | 5/2003 | Tsuneta et al. | 250/311 |

FOREIGN PATENT DOCUMENTS

| JP | 7-176285 | 7/1995 |
|---|---|---|
| JP | 10-92354 | 4/1998 |
| JP | 11-138242 | 5/1999 |

* cited by examiner

*Primary Examiner*—John R. Lee
*Assistant Examiner*—Phillip Johnston
(74) *Attorney, Agent, or Firm*—Mattingly, Stanger & Malur, P.C.

(57) ABSTRACT

By use of charged particle beam images picked up in different conditions, a positional displacement caused by parallax is analyzed, and an optics of an apparatus for charged particle beam microscopy is corrected automatically. An analysis method using phase difference of Fourier transform images and having analytic accuracy lower than that for one pixel is adopted for the displacement analysis. In addition, a degree of coincidence between images calculated in this analysis method is used as a criterion for evaluating the reliability of an analysis result. Since the analysis method based on parallax is low in specimen dependency, the operation range is expanded. In addition, by adopting a high-accuracy displacement analysis method, the apparatus correction accuracy is improved by one digit. A malfunction preventing flow is added using the degree of coincidence as a judgement criterion. Thus, the apparatus can deal with unmanned operation. In addition, the degree of coincidence can be used as a monitor of inspection states or a record of states in an inspection apparatus.

17 Claims, 22 Drawing Sheets

FIG. 6A  FIG. 6B  FIG. 6C
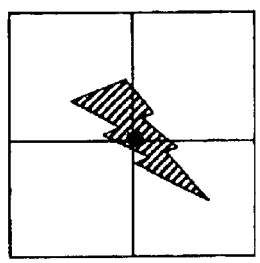
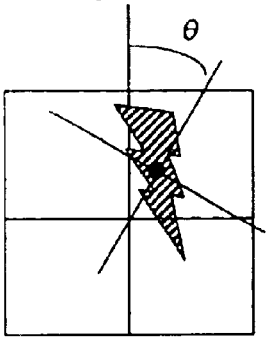
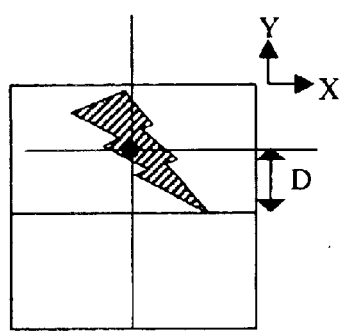
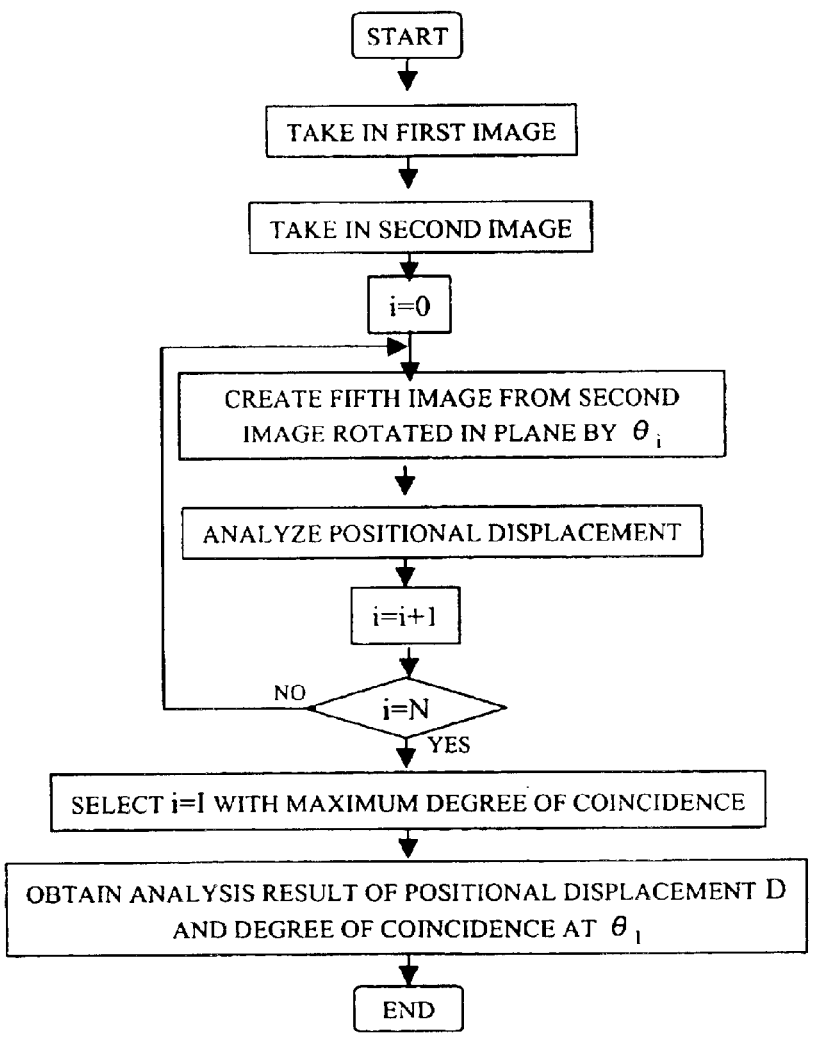
FIG. 7

FIG. 9A

AUTOMATIC ALIGNMENT

MODULATED AMPLITUDE: 1.32A
NUMBER OF TIMES OF CORRECTION: 2
LOWER LIMIT OF DEGREE OF COINCIDENCE: 30
DISPLACEMENT: 11DIGIT
DEGREE OF COINCIDENCE: 53
(ERROR) [MEASURE] [CORRECT]

FIG. 9B

AUTOMATIC ALIGNMENT

MODULATED AMPLITUDE: 2
DISPLACEMENT: 11DIGIT
DEGREE OF COINCIDENCE: 53
(ERROR) [CORRECT]

FIG. 17A

AUTOMATIC FOCUS CORRECTION

MODULATED AMPLITUDE: 1.32A
NUMBER OF TIMES OF CORRECTION: 2
LOWER LIMIT OF DEGREE OF COINCIDENCE: 30
DISPLACEMENT: 11DIGIT
DEGREE OF COINCIDENCE: 53
(ERROR) [MEASURE] [RECORD] [EXECUTE]

FIG. 17B

AUTOMATIC FOCUS CORRECTION

MODULATED AMPLITUDE: 2
DISPLACEMENT: 11DIGIT
DEGREE OF COINCIDENCE: 53
(ERROR) [RECORD] [EXECUTE]

FIG. 14A
FIG. 14B
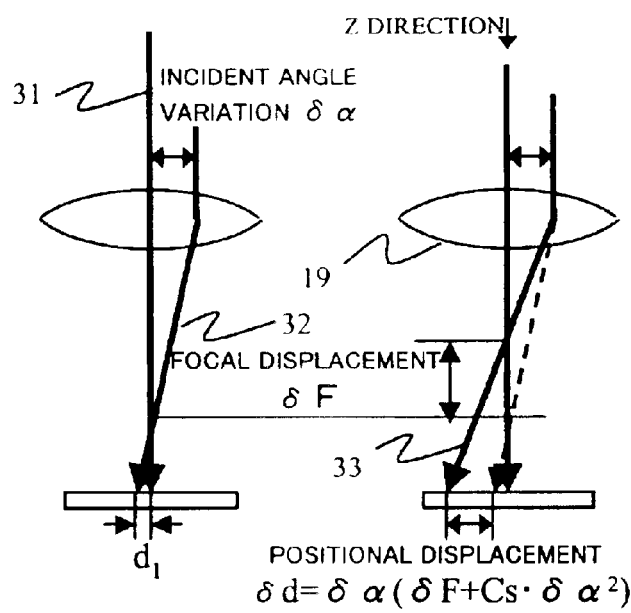
$\delta d = \delta \alpha ( \delta F + Cs \cdot \delta \alpha^2 )$
FIG. 15
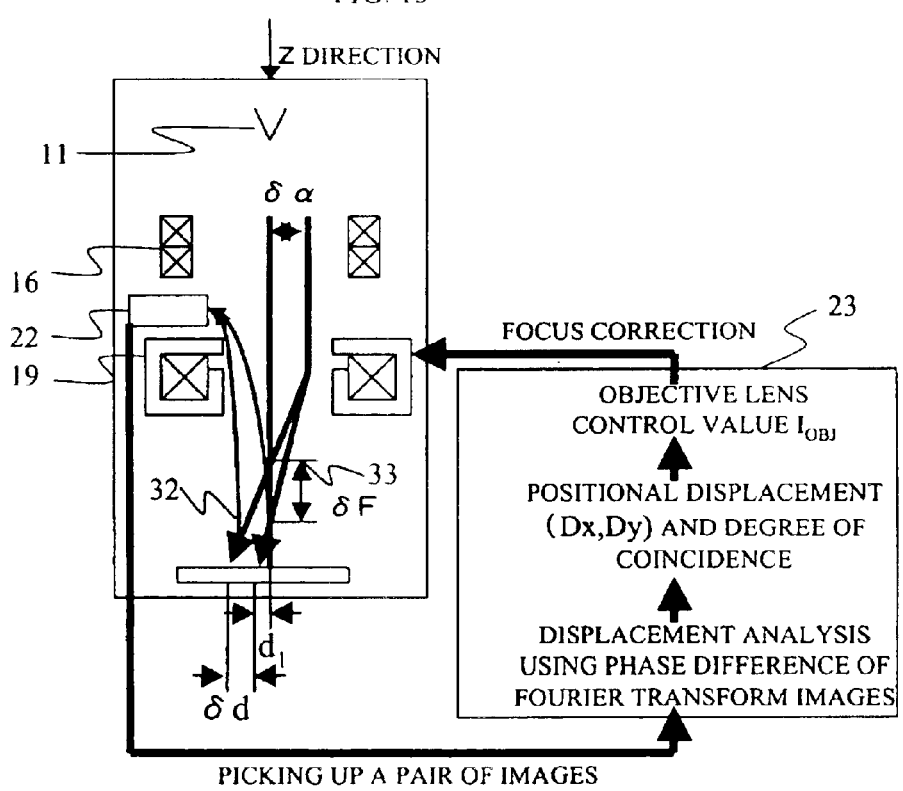

FIG. 23

| INFORMATION OF INSPECTED SEMICONDUCTOR WAFER | CLASSIFICATION | CONTENT, MATERIAL, ETC. | SUITABLE IRRADIATION ENERGY RANGE | IRRADIATION ENERGY OPTIMUM VALUE |
|---|---|---|---|---|
| PATTERN OF FORMING | HOLE | AFTER PHOTO-RESIST DEVELOPMENT<br>AFTER ETCHING<br>AFTER PLANTING CONDUCTIVE MATERIAL | 1KV TO 3KV<br>1KV TO 5KV<br>0.3KV TO 3KV | 1.5KV TO 3KV<br>1.5KV TO 5KV<br>0.3KV TO 0.5KV |
| | WIRING | CONDUCTIVE MATERIAL (METAL, QUASI-METAL)/INSULATING MATERIAL | 0.3KV TO 5KV | 1KV TO 3KV |
| | | CONDUCTIVE MATERIAL COATED WITH SIN OR TIN | 1.5KV TO 5KV | 1.5KV TO 3KV |
| STEP | HIGH STEP | HIGH ASPECT RATIO<br>HIGH STEP WIRING<br>CAPACITANCE POSITION | 1.5KV TO 5KV | 3KV |
| | MIDDLE STEP | GATE WIRING<br>LOW ASPECT RATIO | 0.8KV TO 3KV | 0.8KV TO 1.5KV |
| | LOW STEP | AFTER PLANTING AND SMOOTHING (ETCH BACK, CMP GRINDING, ETC.) | 0.3KV TO 1KV | 0.5KV |
| KIND OF DEFECT TO BE DETECTION | ELECTRIC DEFECT | HOLE DISCONTINUITY<br>TRANSISTOR SHORT-CIRCUIT | 0.3KV TO 3KV | 0.5KV TO 0.8KV |
| | RESIDUAL THIN FILM | | 0.3KV TO 3KV | 0.5KV |
| | SHAPE DEFECT | SHORT-CIRCUIT, DISCONTINUITY<br>ISOLATED DEFECT<br>PROJECTION<br>CRACK | 1KV TO 5KV | 1KV TO 3KV |
| | PARTICLE | | 0.5KV TO 3KV | 1.5KV TO 3KV |

METHOD AND APPARATUS FOR CHARGED PARTICLE BEAM MICROSCOPY

BACKGROUND OF THE INVENTION

The present invention relates to an apparatus for automatically adjusting an optics of an apparatus for charged particle beam microscopy.

As for automatic correction of an optics of an apparatus for charged particle beam microscopy, there are three known examples as follows. A known example 1 is an automatic alignment unit for a scanning electron microscope disclosed in JP-A-10-92354. In order to adjust a primary electron beam to pass through the center of an objective lens, images before and after varying an exciting current for the objective lens are acquired respectively. After the acquired images are binarized, the displacement direction and the displacement distance of the image caused by misalignment are calculated. An alignment unit is controlled so that the displacement distance vanishes. A known example 2 is an automatic focus corrector for a scanning electron microscope disclosed in JP-A-7-176285. The focused state of a primary charged particle beam is varied. A high frequency component of an image acquired in each focused state is extracted, and an integral value of one screen of the absolute value thereof is recorded. Such integral values in the respective focused states are compared, and a focused state of the primary charged particle beam having a maximum integral value is judged to be an in-focus state. A known example 3 is an automatic focus corrector for a transmission electron microscope disclosed in JP-A-11-138242. When a specimen is located in an in-focus plane, an image is not displaced before and after the incident angle of a primary electron beam is varied. However, if the specimen is out of the in-focus plane, the image is displaced before and after the incident angle of the primary electron beam is varied. This parallactic displacement is analyzed in a method using phase difference of Fourier transform images, and converted into a focal displacement so as to correct the focus.

Problems in the respective known examples will be summarized as follows.

As for the automatic alignment unit as described in the known example 1, there can be mentioned a restriction on applicable specimens. It is difficult to apply image processing including image binarization to a low-S/N, that is, low-contrast image. Such image processing can operate only in a high-contrast field of view for adjusting an optics. In addition, geometrical analysis is easily affected by image deformation caused by a focal variation, so that satisfactory displacement analysis accuracy, that is, alignment analysis accuracy cannot be obtained.

In addition, the displacement analysis used in the known example 1 has no function to express the reliability of its analytic result numerically. Even if analytic impossibility has been caused by image deterioration, an incorrect analytic result is outputted as it is. For example, if a displacement from an optical axis is too large, a specimen may get out of a field of view due to a focal variation so as to cause impossibility of displacement analysis. In addition, if a focal variation is too large, an image may be indistinct enough to cause impossibility of displacement analysis. In the automatic corrector, there is no guarantee that analysis is always carried out correctly. Therefore, means for evaluating the reliability of the analytic result, and a function to interrupt the correction when the reliability runs short are required.

As for the automatic focus corrector as described in the known example 2, dependency of analytic accuracy on specimens can be mentioned as a problem. If a specimen itself has a sharp structure, there can be seen a clear difference in integral value of high frequency components between an image when the specimen is in focus and an image when the specimen is out of focus. However, if a specimen itself does not have a sharp structure, there is little difference in integral value of high frequency components between an image when the specimen is in focus and an image when the specimen is out of focus.

In addition, a large number of data are required in a so-called asymptotic method in which the conditions of an objective lens maximizing the sharpness of an image are searched while the conditions of the objective lens are varied. Data take-in time is limited by physical factors such as the luminance of a charged particle source, the sensitivity of a detector, and so on. Therefore, if data take-in time per unit data is made too short, the S/N ratio of data deteriorates so that analysis becomes difficult. In addition, if the number of data to be taken in is reduced, analytic accuracy deteriorates.

In addition, in the same manner as in the known example 1, there is no index for evaluating the reliability of an analytic result. Therefore, even if a focus cannot be analyzed because there is no sharp structure in the field of view, an incorrect analytic result is outputted as it is.

In the automatic focus corrector for a transmission electron microscope as described in the known example 3, it is assumed that there is a deflector for varying only the incident angle of a primary electron beam. Only in the case where the deflection fulcrum of the deflector agrees with the in-focus plane of an objective lens, only the angle of the primary electron beam incident to a specimen varies when a deflector control value is varied. In any corrector having no deflector with a deflection fulcrum substantially agreeing with the in-focus plane, focal displacement analysis cannot be carried out.

SUMMARY OF THE INVENTION

Measures carried out for adjusting an optics of an apparatus for charged particle beam microscopy stably, at a high speed and with high accuracy will be shown below.

For analysis of axial displacement, an analysis method using phase difference of Fourier transform images is applied to displacement analysis between images before and after an objective lens current is varied. This displacement analysis method can analyze even low-contrast images. It can be assumed that there is only a δ peak in a position corresponding to a positional displacement in an processed image obtained by inverse Fourier transform of a phase difference image between Fourier transform images of the respective images. Accordingly, the position of the δ peak, that is, the displacement between the images can be obtained with accuracy of 1 pixel or less by the calculation of the center of gravity of the δ peak position. Further, intensity of the δ peak calculated after standardizing the intensity of the processed image can be regarded as a degree of coincidence between the images. Since this degree of coincidence can be regarded as a degree of reliability of the analytic result, an acceptance/rejection judgement function for the analytic result using the degree of coincidence is provided.

As for the focus correction, a focus analysis method is operated only in a specimen for adjusting an optics in consideration of specimen dependency and analysis time, and the following analysis method is applied to fine adjustment of focus when an image is picked up. In this focus analysis, it is utilized that the following relationship is established even in an apparatus with a deflector in which the fulcrum of deflection does not agree with the in-focus plane of an objective lens. In a first focal displacement $F_1$ set by an operator or specified in an analysis method using sharpness of an image as a criterion for evaluation, images before and after a deflector control value is varied are acquired respectively, and a first positional displacement $D_1$ between the images is analyzed. Here, the control value is a current value, a voltage value, or a digital signal for controlling them. On the assumption that the incident angle variation, that is, the axial displacement variation of a primary electron beam is $\delta\alpha$, the magnification is M, and the spherical aberration coefficient is Cs, the positional displacement $D_1$ and the focal displacement $F_1$ have a relation of $D_1=M\cdot\delta\alpha(S+F_1+Cs\cdot\delta\alpha^2)$. The item S designates an image shift caused by the disagreement of the deflection fulcrum with the in-focus plane of the objective lens. After that, when the images before and after a deflector control value is varied are acquired respectively in the position where the focal displacement is $F_1+\delta F$, the positional displacement D between the images can be expressed by $D_1+\delta D=M\cdot\delta\alpha(S+F_1+\delta F+Cs\cdot\delta\alpha^2)$. Thus, a difference $\delta F$ from the first focal displacement $F_1$ can be obtained from a difference $\delta D$ from the first positional displacement $D_1$.

BRIEF DESCRIPTION OF THE DRAWINGS

FIGS. 6A to 6C show a first image, a second image and a fifth image made up by in-plane rotation of the second image by an angle $\theta_I$, respectively, which images are used for explaining the step of displacement analysis between images at an angle $\theta$ with each other and displacement analysis between images with a positional displacement D from each other;

FIG. 7 is a flow chart showing the step of analyzing a positional displacement between images having a relation of rotation with each other;

FIG. 9A shows a screen for use in automatic alignment, and FIG. 9B shows a simplified screen of FIG. 9A;

FIGS. 14A and 14B are explanatory views showing the relationship between a positional displacement and a focal displacement between images caused by an axial displacement variation from an optical axis, FIG. 14A shows the case of in-focus, and FIG. 14B shows the case of out-of-focus;

FIG. 15 is a view showing a basic configuration of an automatic focus correction unit in an electron microscope;

FIG. 17A shows a screen for use in automatic focus correction, and FIG. 17B shows a simplified screen of FIG. 17A;

FIG. 21A shows the case of a small axial displacement, and FIG. 21B shows the case of a large axial displacement;

FIG. 23 is a table showing electron beam irradiation conditions suitable for a semiconductor device circuit pattern;

DETAILED DESCRIPTION OF THE INVENTION (Embodiment 1)

Figure 2:
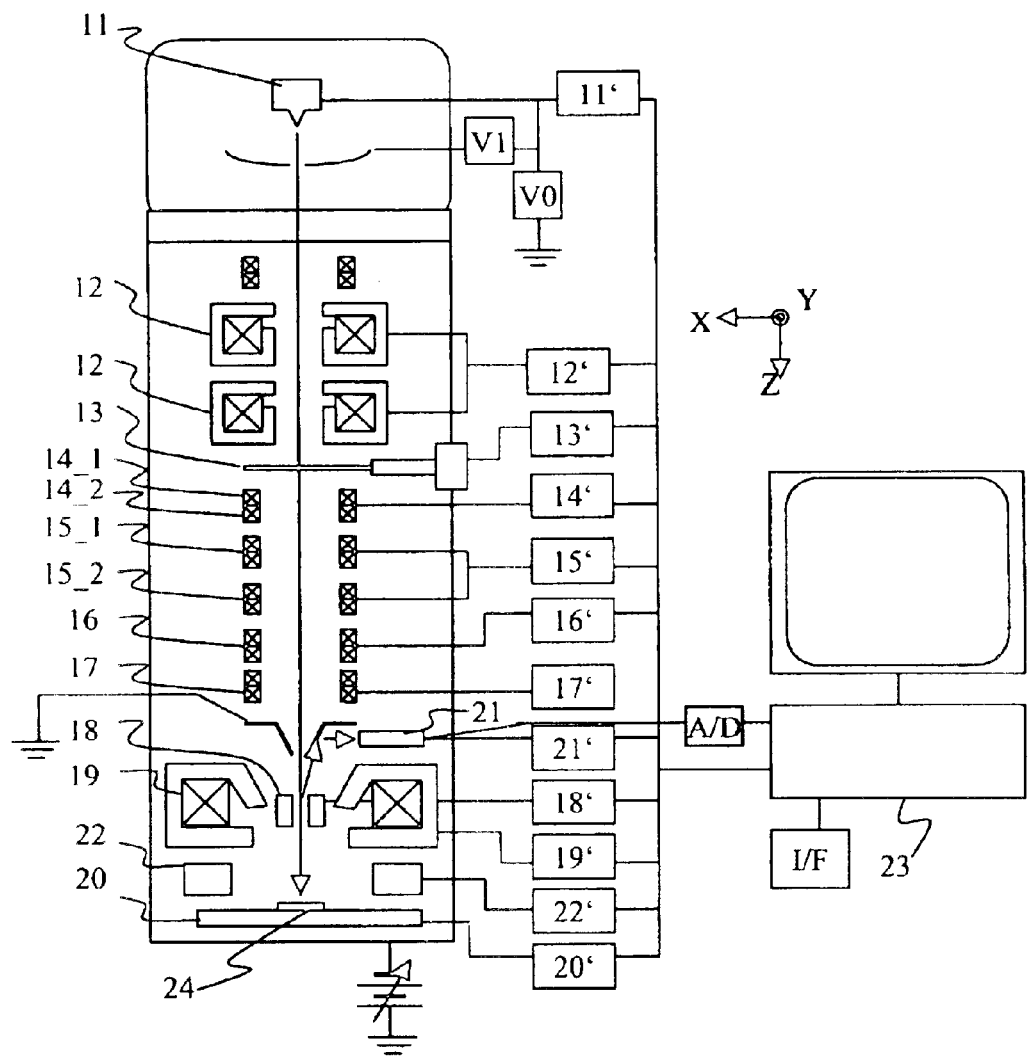
FIG. 2 is a view of a basic configuration of a scanning electron microscope.

FIG. 2 is a view showing a basic configuration of a scanning electron microscope for use in an embodiment of the present invention. The scanning electron microscope is constituted by an electron gun 11 and a control circuit 11' for controlling a primary electron beam acceleration voltage or an extraction voltage; condenser lenses 12 and a control unit 12' for controlling current values thereof; an objective aperture 13 and a control unit 13' for controlling the hole position of the objective aperture; stigmators 14_1 and 14_2, and a control unit 14' for controlling current values thereof; alignment deflectors 15_1 and 15_2 for the respective stigmators, and a control unit 15' for controlling voltage values or current values thereof; an alignment deflector 16 for condenser lens, and a control unit 16' for controlling a voltage value thereof; a scanning deflector 17 and a control unit 17' for controlling a voltage value or a current value thereof; an ExB deflector 18 and a control unit 18' for controlling a voltage value or a current value thereof; an objective lens 19 and a control unit 19' for controlling a current value thereof; a specimen stage 20 and a control unit 20' for controlling the position thereof; an electron detector 21, and a control unit 21' for controlling the gain or the offset thereof; a specimen height sensor 22 using laser, and a control unit 22' for controlling the measuring conditions thereof; and a computer 23 with a control program and an image processing program. The respective control units are controlled by commands from the computer 23. An image of a secondary electron beam emitted from a specimen in response to a primary electron beam incident to the specimen is formed synchronously with an electron beam scanning signal of the scanning deflector 17 and an output signal of the electron detector 21. The formed image is transmitted to the computer 23 through an image transmitting cable at a high speed. The computer 23 analyzes the transmitted image, obtains apparatus control values, and adjusts the scanning electron microscope.

Figure 3:
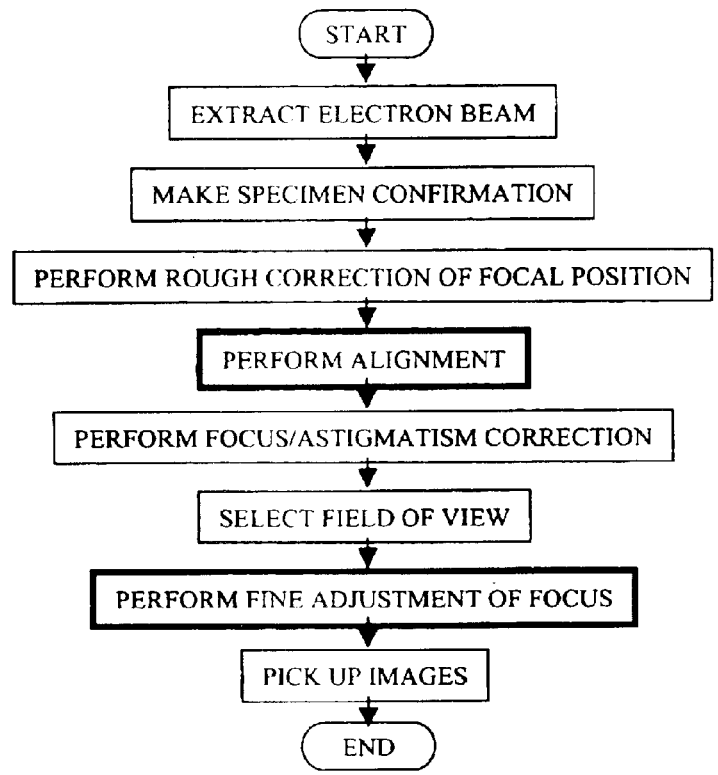
FIG. 3 is a flow chart showing the step of picking up electron microscope images.

First, the step to obtain a scanning electron microscope image will be shown in FIG. 3. A primary electron beam is extracted from the electron gun 11 with an extraction voltage V1, and an acceleration voltage V0 is applied to the primary electron beam. Assume that a direction parallel to the optical axis of a mirror body is a Z direction, and a plane orthogonal to the optical axis is an XY plane. A specimen 24 is inserted, and the height of the specimen 24 is obtained by the specimen height sensor 22 using laser. Then, the Z position of the specimen stage 20 is adjusted or the control value of the objective lens 19 is adjusted so that the focus is corrected to be in a range where an image can be analyzed. That is, rough adjustment of the focus is carried out. This rough adjustment may be carried out using an image of the specimen 24 while confirming the image at a low magnification. An XY moving mechanism for the specimen stage 20 is used to select a field of view for adjusting an electron beam optics. Next, the displacement of the incident primary electron beam from the optical axis of the objective lens 19 is corrected. While the image shift when the focus of the objective lens 19 is varied is detected, the position of the hole of the objective aperture 13 or the control value of the alignment deflector 16 is adjusted to minimize the image shift. Next, the optical axes of the stigmators 14 are adjusted. While the image shift when the control values of the respective stigmators 14 are varied is detected, the control values of the alignment deflectors 15 for the stigmators are adjusted to minimize the image shift. After such alignment, focus/astigmatism is corrected to be in the field of view for adjusting the electron beam optics. Next, the specimen stage 20 is used to move to a field of view for photography. After the focus of the objective lens 19 is fine adjusted so that an image can be observed clearly, the image is taken in.

The present invention described below relates to automation of alignment of the objective lens, alignment of the stigmators, and fine adjustment of the focus of the objective lens in the field of view for photography, among the above-mentioned steps.

Figure 4:
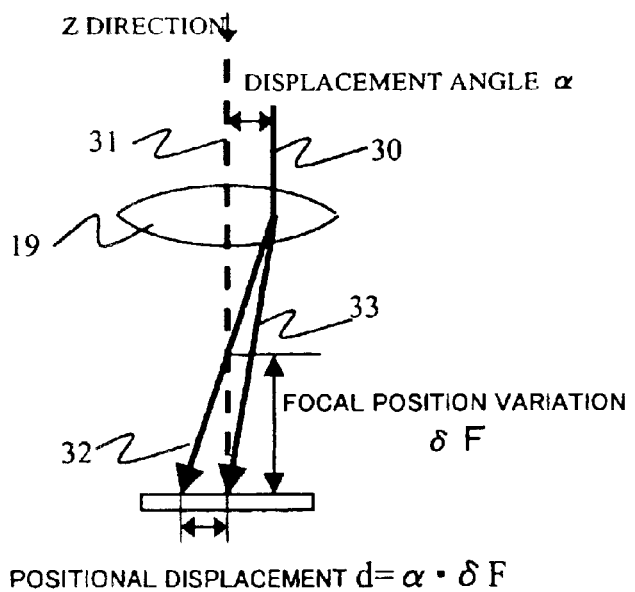
FIG. 4 is an explanatory view showing the relationship between a positional displacement D of an image and an axial displacement $\alpha$ from an optical axis caused by the variation of a focus.

First, FIG. 4 shows an explanatory view of the analysis of axial displacement of the objective lens. When a primary electron beam 30 incident to the objective lens is displaced from an optical axis 31 of the objective lens 19 by $\alpha=(\alpha_x, \alpha_y)$ at a magnification M, the Z coordinate of the focus is varied from a first setting by $\delta F$ in response to the variation of the control value of the objective lens. If the focus of the objective lens is set thus into a second setting, the position of the primary electron beam incident to the specimen is displaced by $(d_x, d_y)=\delta F \cdot (\alpha_x, \alpha_y)$. Accordingly, there is a positional displacement $(D_x, D_y)=M \cdot (d_x, d_y)$ between a first image picked up when the focus of the objective lens is set in the first setting at the magnification M, and a second image picked up when the focus of the objective lens is set in the second setting likewise. The axial displacement $(\alpha_x, \alpha_y)$ is obtained by use of this relationship. A control value $(I_{AL\_x}, I_{AL\_y})$ of the alignment deflector 16 required for making the axial displacement $(\alpha_x, \alpha_y)$ be substantially zero is calculated to correct the axial displacement.

Figure 1:
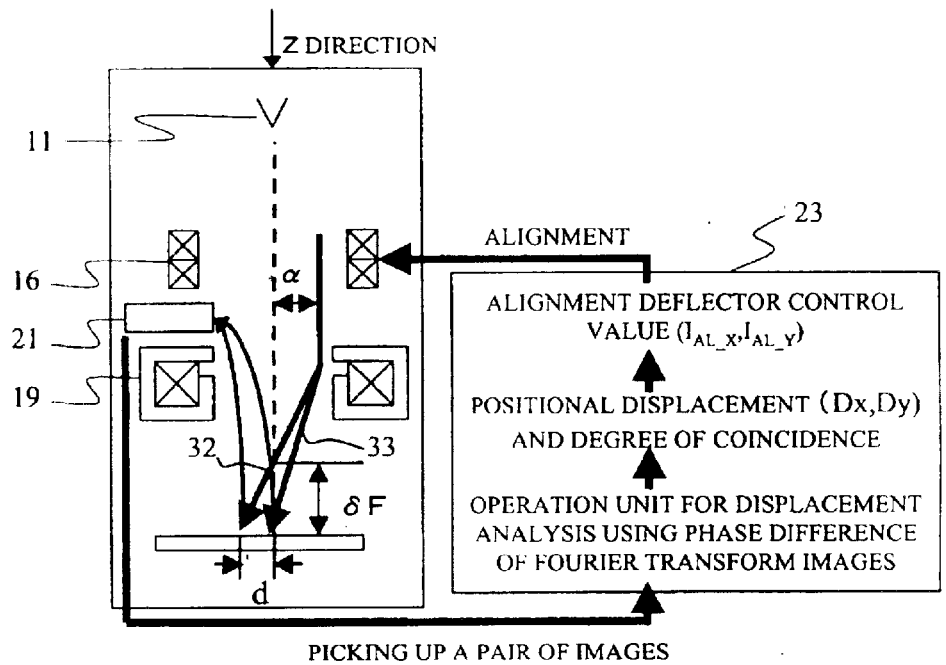
FIG. 1 is a view of a basic configuration of an automatic alignment unit using an alignment deflector in an electron microscope.

FIG. 1 shows a basic configuration of an automatic alignment unit for the objective lens 19. After the field of view, the magnification, and so on, are established, the focus of the objective lens 19 is set to the first setting. Then, a first image is picked up. The control value of the objective lens 19 is varied to set the focus of the objective lens 19 to the second setting. Then, a second image is picked up. The computer 23 performs such control. In addition, the computer 23 calculates a positional displacement D and a degree of coincidence between the first and second images by use of a displacement analysis method using phase difference of Fourier transform images, judges whether alignment should be carried out or not on the basis of the degree of coincidence, and calculates the control value $(I_{AL\_x}, I_{AL\_y})$ of the alignment deflector 16 required for making the positional displacement $(D_x, D_y)$ be substantially zero. Thus, alignment is carried out. In the scanning electron microscope, it is difficult to measure the physical absolute value of a focal displacement variation caused by the variation of the control value of the objective lens 19, or the physical absolute value of the axial displacement variation caused by the variation of the control value of the alignment deflector 16. In addition, in order to make the axial displacement be substantially zero, it is not necessary to know the absolute value of the focal displacement or the axial displacement. Therefore, the positional displacement D is converted directly into a variation of the control value of the alignment deflector 16, and the control value of the alignment deflector 16 is set on the basis of the calculation result. Thus, the axial displacement is corrected.

Incidentally, in order to vary the focus of the objective lens on a specimen, an acceleration voltage for the primary electron beam may be varied. The optical axis with which the image shift is minimized when the control value of the objective lens is varied is called a current center axis. The optical axis with which the image shift is minimized when the acceleration voltage is varied is called a voltage center axis. Although description is made with the current center axis by way of example in this embodiment, similar alignment can be carried out by the voltage center axis if the focus of the objective lens 19 is designed to be varied by the variation of the acceleration voltage.

Figure 5:
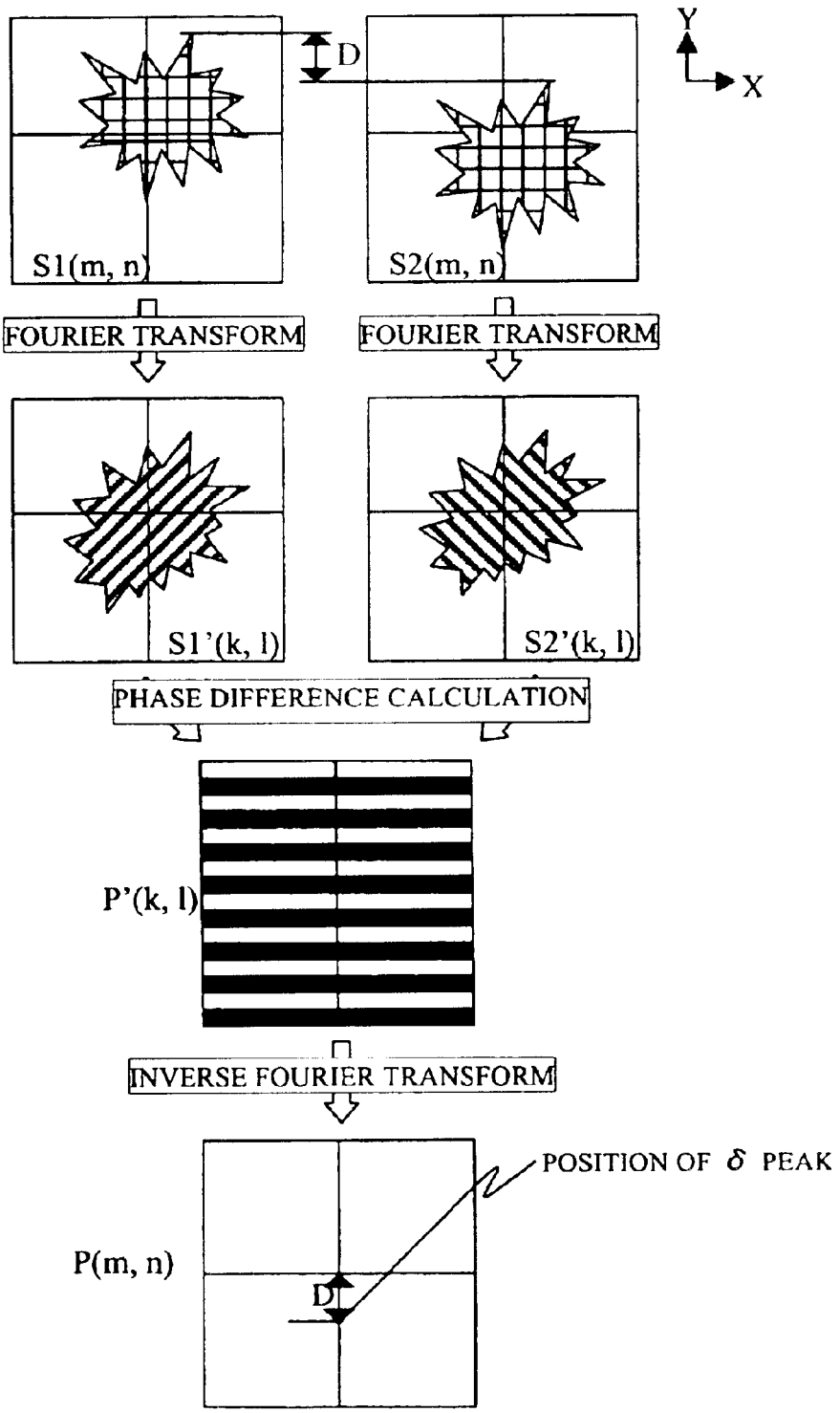
FIG. 5 is an explanatory view showing a calculation process for displacement analysis.

Here, FIG. 5 shows an explanatory view of a displacement analysis method using phase components of Fourier transform. Assume that two images S1 and S2 with a positional displacement $D=(D_x, D_y)$ are described as $S1(n, m)=S2(n+D_x, m+D_y)$. Assume that two-dimension discrete Fourier transforms of $S1(n, m)$ and $S2(n, m)$ are $S1(k, l)$ and $S2(k, l)$ respectively. Since there is a formula of $F\{S(n+D_x, m+D_y)\}=F\{S(n, m)\}\exp(iD_x \cdot k+iD_y \cdot l)$ in Fourier transform, it can be transformed to $S1(k, l)=S2(k, l)\exp(iD_x \cdot k+iD_y \cdot l)$. That is, the positional displacement between $S1(k, l)$ and $S2(k, l)$ is expressed by the phase difference $\exp(iD_x \cdot k+iD_y \cdot l)=P(k, l)$. Since $P(k, l)$ is also a wave having a period of $(D_x, D_y)$, there appears a $\delta$ peak in the position of $(D_x, D_y)$ in a processed image $P(n, m)$ obtained by inverse Fourier transform of the phase difference image $P(k, l)$. Incidentally, inverse Fourier transform may be applied to an image in which processing of log or root has been carried out on an amplitude component of $S1(k, l) \cdot S2(k, l)^*=|S1||S2|\exp(iD_x \cdot k+iD_y \cdot l)$ so as to restrain the amplitude component without eliminating any information of amplitude. Also in this case, a δ peak is produced in the position ($D_x$, $D_y$) of a displacement vector. Thus, displacement analysis may be performed with such an image. Alternatively, since a δ peak is produced in ($-D_x$, $-D_y$) even if Fourier transform is applied to the phase difference image P(k, l), displacement analysis may be performed with a Fourier transform image of the phase difference image P(k, l).

Since it can be assumed that only a δ peak exists in the processed image P(n, m), the position of the δ peak can be obtained by the calculation of a barycentric position correctly with accuracy as high as decimal. Typically, for example, on the assumption that the size of one pixel is 2 nm and the focal variation is 1 μm at the magnification of a hundred thousand, the axial displacement corresponding to the positional displacement of one pixel is 2 mrad. Then, with accuracy of displacement analysis as high as decimal, a sub-mrad axial displacement can be analyzed.

In addition, any component other than the δ peak can be regarded as noise. Therefore, the ratio of the intensity of the δ peak to the intensity of the processed image P(n, m) as a whole can be regarded as the degree of coincidence between images. In the conventional method of displacement analysis, it is difficult to evaluate the reliability of the displacement analysis result. Therefore, even if an incorrect positional displacement is outputted due to the specimen located out of the field of view or an indistinct image thereof, the deflector 16 is varied directly in accordance with the positional displacement. On the other hand, in this method of displacement analysis, the degree of coincidence is outputted. Therefore, there is provided a function not to carry out alignment if the degree of coincidence is not higher than a predetermined lower limit of the degree of coincidence. Thus, a malfunction caused by a specimen located out of the field of view or an indistinct image thereof is prevented.

In order to convert the positional displacement D into a control value variation $\delta I_{AL}$ of the alignment deflector 16, it is necessary to measure the relationship between the control value variation $\delta I_{AL}$ of the alignment deflector 16 and the positional displacement D in advance. When the control value of the objective lens 19 is varied by $\delta I_{OBJ\_m1}$ at the magnification $M_{m1}$, a positional displacement $D_0=(D_{x\_0}, D_{y\_0})$ between images at $I_{AL}=(I_{AL\_x}, I_{AL\_y})$ is analyzed, and a positional displacement between the images at $I_{AL}+dI_{AL\_m1}=(I_{AL\_x}+dI_{AL\_m1\_x}, I_{AL\_y}+dI_{AL\_m1\_y})$ is analyzed so that a difference $\delta D_{m1}=(dD_{m1\_x}, dD_{m1\_y})$ from the positional displacement $D_0$ is obtained.

When the relationship between the positional displacement $\delta D_{m1}$ and the control value variation $\delta I_{AL\_m1}$ of the alignment deflector 16 is to be obtained, it is necessary to carry out correction using a control value $I_{OBJ}$ of the objective lens 19. This is because an image rotates around the optical axis if the control value $I_{OBJ}$ of the objective lens 19 is varied, so that the axial displacement variation direction of the primary electron beam caused by the alignment deflector 16 may not agree with the shift direction of the image. Therefore, first, an angle θ between the direction of the control value variation $\delta I_{AL\_m1}=(dI_{AL\_m1\_x}, dI_{AL\_m1\_y})$ of the alignment deflector 16 and the direction of the positional displacement $\delta D_{m1}=(dD_{m1\_x}, dD_{m1\_y})$ is obtained. With a value $\delta D_{m1\_\theta}=(dD_{m1\_x\_\theta}, dD_{m1\_y\theta})$ obtained by in-plane rotation of the positional displacement δD by the angle θ, the direction of the positional displacement is made to substantially agree with the direction of the control value variation of the alignment deflector 16. Incidentally, the image rotation angle θ by the objective lens 19 depends on the control value $I_{OBJ}$ of the objective lens 19.

In order to deal with the case where a specimen has a large variation in height, different control values $I_{OBJ}$ of the objective lens 19 are set while the specimen height is varied, and the angle θ is measured in each of the values $I_{OBJ}$. Then, the angle $\theta=\theta_{OBJ}\cdot I_{OBJ}+\theta_0$ using the control value of the objective lens 19 as a correction item is obtained. Here, the values $\theta_{OBJ}$ and $\theta_0$ are constants proper to the apparatus.

In addition, there is a case where the image rotation quantity by the variation of the control value of the objective lens 19 is so large that image rotation around the optical axis occurs between the first and second images. In the conventional method of displacement analysis, it is difficult to analyze a positional displacement between images with image rotation. However, in the method of displacement analysis used in the present invention, displacement analysis can be made even between images with image rotation. FIG. 7 shows a displacement analysis flow chart in the case where the first image (FIG. 6A) and the second image (FIG. 6B) have an angle difference θ as shown in FIGS. 6A to 6C. The second image is rotated around the center of the image by an angle $\theta_i$ so as to form a fifth image. The above-mentioned displacement analysis is carried out between the fifth image and the first image. Then, the degree of coincidence and the positional displacement between the images are calculated and recorded. Such a process is repeated with respect to a plurality of rotation angles. The degree of coincidence becomes maximum when the angle difference between the first image and the fifth image is substantially zero. Therefore, of the obtained analytic results on the respective rotation angles, a rotation angle $\theta_I$ with which the degree of coincidence becomes maximum can be regarded as the rotation angle between the first image and the second image. A positional displacement calculated by an image (FIG. 6C) obtained by rotating the second image by the angle $\theta_I$ is regarded as the positional displacement between the first image and the second image.

In addition, the axial displacement δ α of the primary electron beam is substantially proportional to the control value variation $\delta I_{AL}$ of the alignment deflector 16. However, since the alignment deflector 16 is provided in the upper portion of the objective lens 19 as shown in FIG. 2, the position of the primary electron beam incident to a specimen is also varied by the electromagnetic field of the objective lens 19. In order to deal with the case where the specimen has a large height variation, a correction item using the control value $I_{OBJ}$ of the objective lens 19 as a parameter is introduced into the relational expression between the control value variation $\delta I_{AL\_m1}$ of the alignment deflector 16 and the positional displacement $\delta D_{m1\_\theta}$, so as to associate them by the expression $\delta D_{m1\_\theta} \propto (A+B\cdot I_{OBJ})\delta I_{AL\_m1}$. Here, A and B are coefficients proper to the apparatus. In addition, since the focus variation is proportional to the control value variation of the objective lens 19, the relation $\delta F \propto \delta I_{OBJ}$ is established. While the relation $\delta D_{m1\_\theta}=M_{m1}\cdot \delta I_{OBJ\_m1}\cdot (A+B\cdot I_{OBJ}) \delta I_{AL\_m1}$ is set, positional displacements $\delta D_{m1\_\theta}$ are measured in respective control values $I_{OBJ}$ so as to specify the coefficients A and B. When the control value variation of the alignment deflector 16 is calculated from the positional displacement, the expression $\delta D_{m1\_\theta'}=dD_{m1\_\theta}/(A+B\cdot I_{OBJ})$ is used.

Thus, the relationship between the control value variation $\delta I_{AL\_m1}$ of the alignment deflector 16 and the positional displacement $\delta D_{m1}$ is measured and recorded in the computer 23. Then, alignment is carried out. In the case of the positional displacement $D=(D_x, D_y)$ at the magnification M when the control value of the objective lens 19 is varied by $\delta I_{OBJ}$, the objective lens control value correction is carried out to convert the positional displacement D into D$\theta_r$. After that, a control value variation $\delta I_{AL}=-(M_{m1} \cdot \delta I_{OBJ\_m1}/M \cdot \delta I_{OBJ}) \cdot (D_{\theta\_x}' \cdot \delta I_{AL\_m1\_x}/dD_{m1\_x\_\theta}',\ D_{\theta\_y}' \cdot \delta I_{AL\_m1\_y}/dD_{m1\_y\_\theta}')$ of a deflector for alignment required for canceling the axial displacement is calculated.

Incidentally, in photography with a low magnification, that is, with a wide field of view, there may appear so-called peripheral distortion, which is a difference between a primary electron beam passing through the vicinity of the optical axis and a primary electron beam passing through a peripheral portion distant from the optical axis due to the influence of a peripheral magnetic field of the objective lens 19. When peripheral distortion is produced, there occurs a difference in positional displacement caused by the control value variation of the objective lens 19 among respective areas in the image. Thus, displacement analysis using the image as a whole becomes difficult. To deal with such a difficulty, it is preferred to carry out displacement analysis as follows. That is, an analytic range of the field of view which is uniform enough to analyze the positional displacement is recorded. If a photographic range of the field of view is larger than the analytic range of the field of view, the analytic range of the field of view is cut from the photographic range of the field of view. Then, displacement analysis is carried out in the analytic range of the field of view.

Figure 21A:
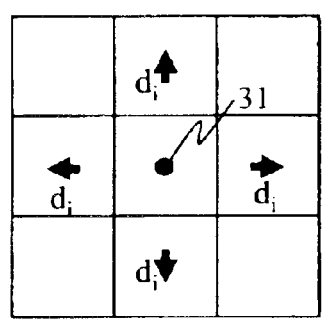
FIGS. 21A and 21B are explanatory views showing the shift of an image when a control value of an objective lens is varied in an electron microscopic image having a peripheral distortion.
Figure 21B:
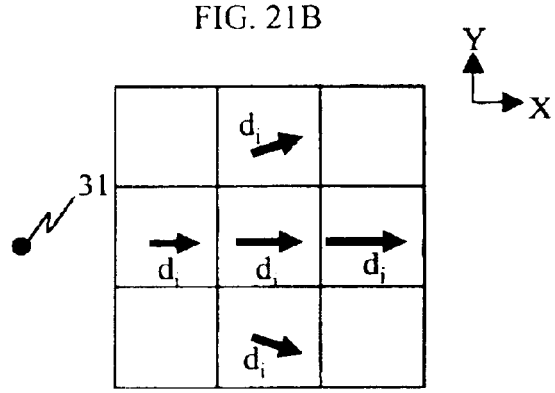

In addition, a positional displacement caused by an axial displacement and a positional displacement caused by peripheral distortion are mixed in an image in which peripheral distortion is produced. The positional displacement caused by peripheral distortion is symmetric with respect to the optical axis. The positional displacement caused by peripheral distortion becomes larger in proportion to the distance from the optical axis. When displacement analysis is carried out in a plurality of areas as shown in FIGS. 21A and 21B, the positional displacement directions in the respective areas become substantially axially symmetric if the axial displacement is small. However, if the axial displacement is large, the positional displacement directions in the respective areas become substantially one direction. Further, if the relationship between the displacement from the optical axis and the positional displacement caused by the control value variation of the objective lens 19, including the peripheral distortion, is measured and recorded in advance, the control value variation of the alignment deflector 16 in which the positional displacement caused by the peripheral distortion has been corrected can be obtained from the difference in positional displacement among the respective areas.

Next, consideration will be made about parameters required for correcting the axial displacement. First, as for the field of view used for correcting the axial displacement, if the axis is displaced largely, the primary electron beam cannot be narrowed sufficiently even in a principal focus. In addition, if the positional displacement caused by the control value variation of the objective lens 19 is also large, a large field of view is required. It is therefore necessary to select the field of view at a low magnification. On the other hand, the lower the magnification is, the lower the resolution of displacement analysis is. Thus, the accuracy of axial displacement analysis deteriorates. In order to carry out axial displacement analysis with high accuracy, it is necessary to select a field of view at a high magnification.

Next, consideration will be made about the control value variation $I_{OBJ}$ of the objective lens 19. The larger the variation $\delta I_{OBJ}$ is, that is, the larger $\delta F$ is, the larger the positional displacement D corresponding to the axial displacement $\alpha$ becomes. Thus, the accuracy of axial displacement analysis is improved. However, if the focus variation $\delta F$ is made too large, the positional displacement D becomes so large that a specimen may be out of the field of view. Particularly at a high magnification, the range of the field of view is narrowed so that the specimen is frequently out of the field of view. To prevent the specimen from being out of the field of view, it is necessary to make the upper limit of the variation $\delta F$ inversely proportional to the magnification M. In addition, the higher the magnification is, the more indistinct the image becomes due to the focus variation $\delta F$. Thus, even if the specimen is not out of the field of view, displacement analysis becomes impossible. The upper limit of the focus variation $\delta F$ determined by the image indistinctness depends on the focal depth of the objective lens 19 or the structure of the specimen 24. Therefore, the upper limit of the focus variation $\delta F$ is preferably determined while the focus is varied really. To this end, the following determination flow is provided. First, displacement analysis is carried out with a focus variation $\delta F$ suggested from the magnification. If the displacement analysis becomes impossible, that is, if the degree of coincidence between images becomes not larger than a lower limit, the focus variation is reduced, and displacement analysis is carried out again.

Incidentally, displacement analysis may be impossible due to a problem in the field of view itself, for example, when there is no characteristic in the field of view. To deal with such a case, the following flow is provided. That is, if displacement analysis is impossible even though the focus variation is substantially zero, that is, if the degree of coincidence is not higher than a lower limit, the magnification is lowered, or the field of view is changed. After that, analysis is carried out again.

Finally, consideration will be made about the influence of errors of apparatus parameters. In order to convert the positional displacement D into the control value variation of the alignment deflector 16, the magnification M, the control value variation $\delta I_{OBJ}$ of the objective lens 19, that is, the focus variation $\delta F$ of the objective lens 19, and other apparatus parameters are required. Each of such parameters usually includes an error. For example, an electron microscope usually has a magnification error of about 5%. Therefore, consideration will be made about the influence of the magnification error on an error of axial displacement analysis when the axial displacement $\alpha$ of the primary electron beam is calculated from the positional displacement D. For example, assume that a positional displacement D is measured when there is an error of M·(1+$\Delta$), that is, $\Delta$ in the magnification. Although an original axial displacement $\alpha$ is $D/[M \cdot (1+\Delta) \cdot \delta F]^{-1}$, the axial displacement is calculated as $\alpha_E = D/[M \cdot \delta F]^{-1}$. The axial displacement analysis error caused by the magnification error is expressed by $\alpha - \alpha_E = -D \cdot \Delta/(1+\Delta) \cdot M \cdot \delta F$. That is, the axial displacement analysis error caused by the magnification error is proportional to the positional displacement D. Therefore, at the time of the positional displacement D=0, the axial displacement analysis error caused by the magnification error becomes smallest. Accordingly, a flow is designed to repeat correction to $\alpha=0$ so as to make the positional displacement D=0. Since the magnification error $\Delta$ of the electron microscope is about 5%, the positional displacement is converged on D~=0 if correction is repeated several times. Thus, the influence of the magnification error can be ignored.

Figure 8:
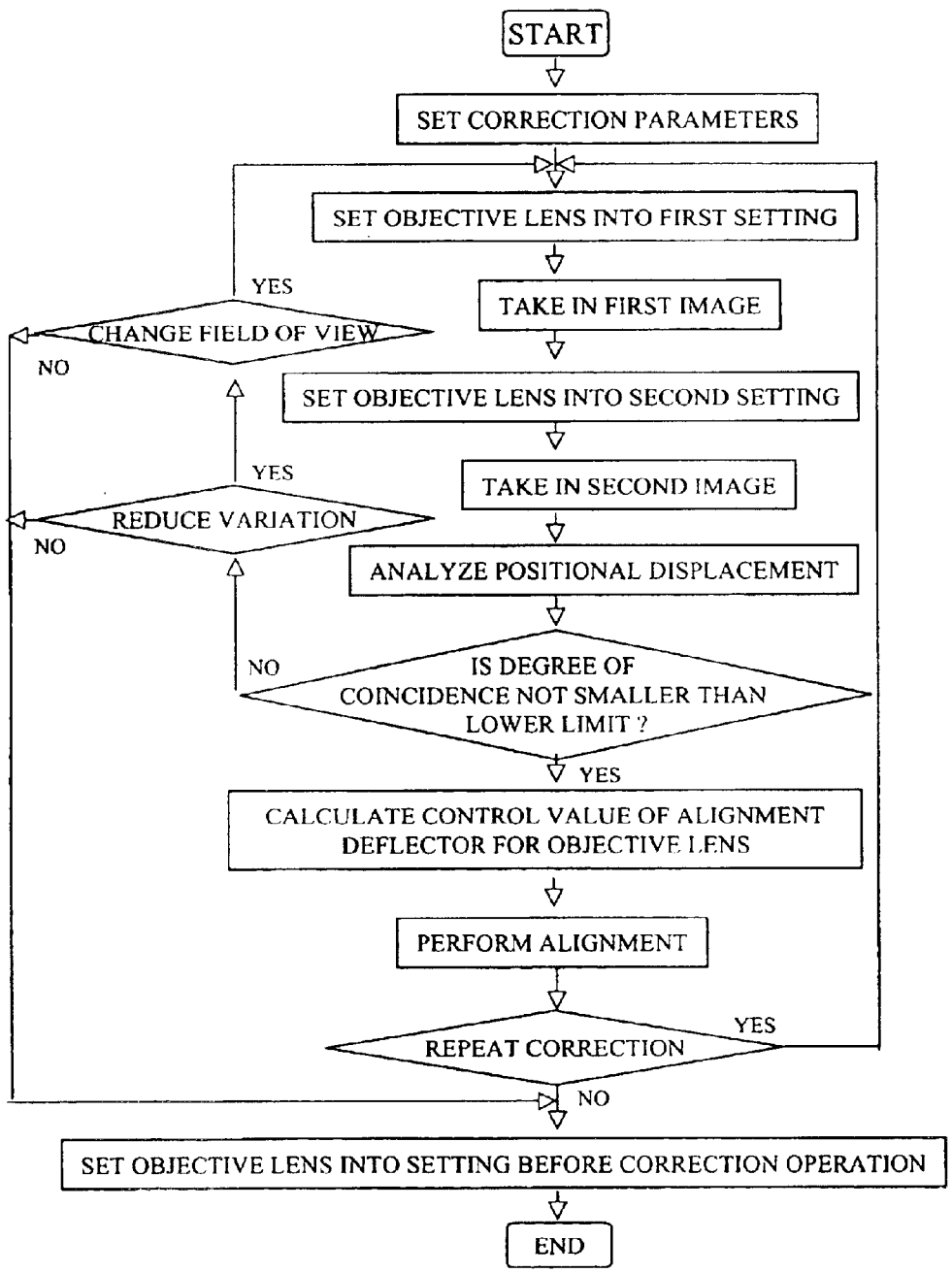
FIG. 8 is a flow chart showing the step of automatic alignment using an alignment deflector.

On the basis of the above-mentioned consideration, alignment is carried out along the flow of FIG. 8. When an instruction to carry out alignment is given after correction parameters are inputted, a first image with the control value of the objective lens 19 in the first setting is started to take in. After the control value of the objective lens 19 is varied into the second setting, a second image is taken in, and a positional displacement between the images is analyzed. With reference to the degree of coincidence between the images obtained by the displacement analysis, if the degree of the coincidence is not lower than a lower limit, the positional displacement is converted into a control value variation of the alignment deflector 16, and alignment is carried out. After alignment is carried out a predetermined number of times, the control value of the objective lens 19 is returned to the setting before the alignment. Thus, the alignment is terminated. If the degree of coincidence is insufficient, the control value variation is first reduced, and axial displacement analysis is started again. When the degree of coincidence is insufficient even if the control value variation is reduced, the magnification or the field of view is varied, and axial displacement analysis is started again. When the degree of coincidence is insufficient even if any measure is taken, the processing is interrupted.

The instruction to carry out alignment is given on a screen shown in FIGS. 9A and 9B. The parameters used for alignment include the magnification M, the control value variation $\delta I_{OBJ}$ of the objective lens 19, the number of times of correction, and the lower limit of the degree of coincidence. Through the window shown in FIG. 9A, the correction parameters are inputted, and a correction execution button is clicked to carry out alignment. The analytic result includes a correction value of the alignment deflector 16 and a degree of coincidence. If the degree of coincidence is not larger than the lower limit, an error message is displayed. Incidentally, when it is intended to examine the alignment state or optimize the correction parameters, a measurement execution button is clicked. When the measurement execution button is clicked, only axial displacement analysis is carried out without correcting the alignment deflector 16.

In addition, if the kind of specimen to be observed is substantially fixed, it is not necessary to change the lower limit of the degree of coincidence and the number of times of correction for every specimen, but initial values thereof are often used as they are. Therefore, unskilled operators can operate more easily through a simple window shown in FIG. 9B. As for the control value variation $\delta I_{OBJ}$ of the objective lens 19, only the size of the variation is selected in accordance with the specimen structure.

Incidentally, even if the deflection fulcrum of the alignment deflector 16 does not agree with the in-focus plane of the objective lens 19, the phenomenon that the positional displacement between the images caused by the focus variation approaches zero as the axial displacement approaches zero is also unchanged. In addition, correction may be not made to make the axial displacement zero, but made as follows. That is, an operator establishes a certain axial displacement, and records a positional displacement caused by the control value variation of the objective lens 19 in the established axial displacement. Then, the alignment deflector 16 is adjusted to make the position displacement be the recorded positional displacement. Thus, correction can be made to be the established axial displacement.

Figure 10:
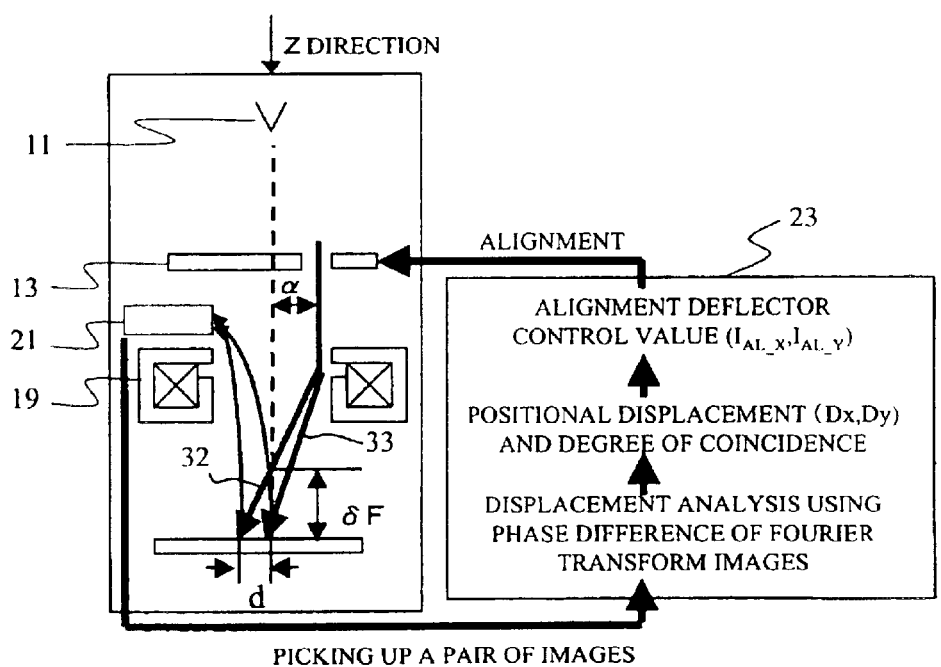
FIG. 10 is a view showing a basic configuration of an automatic alignment unit using an objective aperture in an electron microscope.
Figure 11:
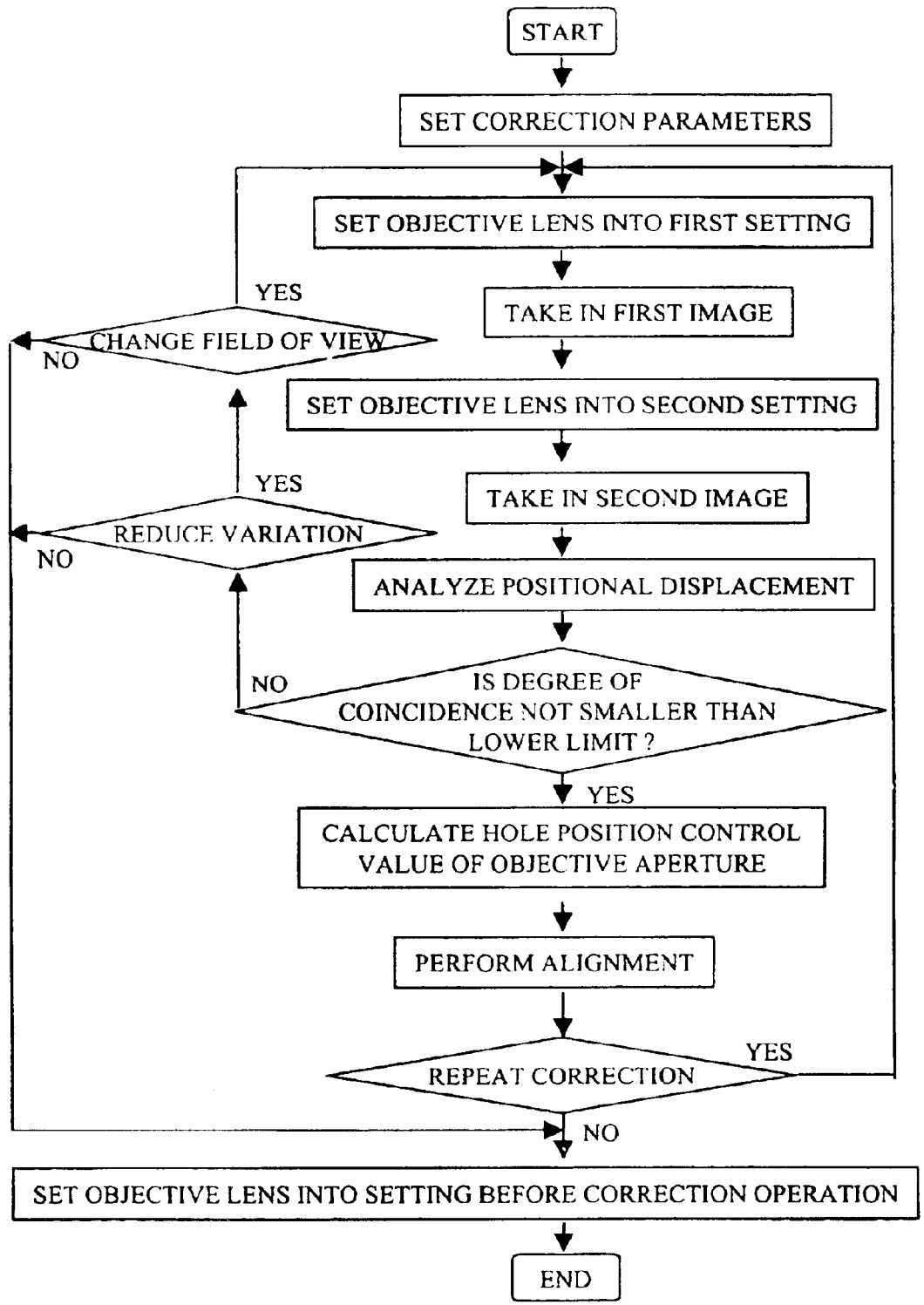
FIG. 11 is a flow chart showing the step of automatic alignment using an objective aperture.

As alignment means for the objective lens 19, there is provided an objective aperture 13 besides the alignment deflector 16. If the hole position of the objective aperture 13 is out of the optical axis, the primary electron beam incident to the objective lens 19 has an axial displacement. FIG. 10 shows a basic configuration of an automatic correction unit for the hole position of the objective aperture 13, and FIG. 11 shows a correction flow thereof. After the field of view, the magnification, and so on, are set, correction parameters such as the control value variation of the objective lens 19 or the like are inputted on a screen similar to those of FIGS. 9A and 9B. Then, if the correction execution button is clicked, correction is started. After a first image with the control value of the objective lens 19 in the first setting is picked up, the control value of the objective lens 19 is varied by $\delta I_{OBJ}$ to be thereby changed into the second setting. Then, a second image is picked up. The degree of coincidence and the positional displacement between the first and second images picked up are analyzed in a displacement analysis method using phase difference of Fourier transform images. Judgement so as whether alignment should be carried out or not is made on the basis of the degree of coincidence, and a control value $(I_{AP\_x}, I_{AP\_y})$ of a hole position control motor for the objective aperture required for making the positional displacement $(D_x, D_y)$ be substantially zero is calculated. This calculation is also carried out by use of conversion coefficients or correction items estimated on the basis of measurement of the relationship between the control value variation $dI_{AP}$ of the hole position control motor for the objective aperture 13 and the positional displacement D in advance.

Incidentally, the alignment by adjusting the hole position of the objective aperture 13 is mechanical correction using a motor, a gear, and so on. Therefore, the range of movement is wide, but the setting accuracy is insufficient. On the other hand, the alignment by adjusting the control value of the alignment deflector 16 is electric correction. Therefore, the range of movement is narrow, but the setting accuracy is high. Accordingly, in an apparatus having both a hole position adjusting mechanism for the objective aperture 13 and the alignment deflector 16, fine adjustment of axial displacement based on the adjustment of the alignment deflector 16 is preferably carried out after rough adjustment of axial displacement based on the adjustment of the hole position of the objective aperture 13.

Figure 12:
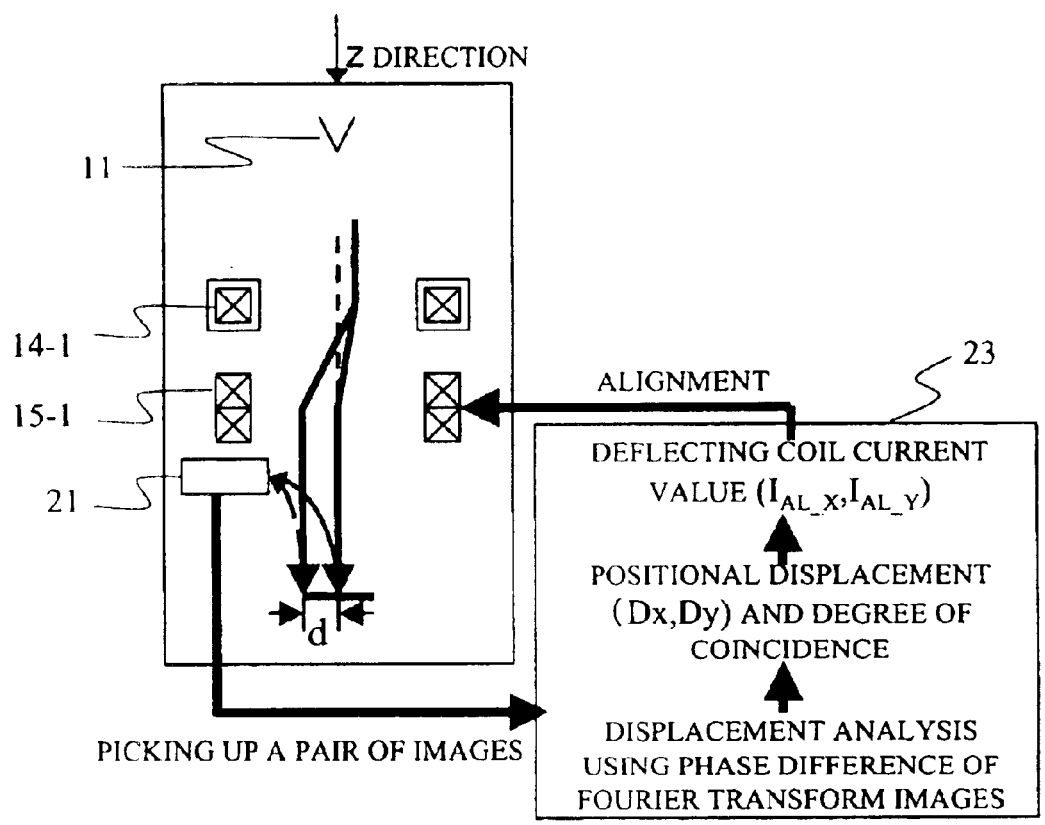
FIG. 12 is a flow chart showing the step of automatic alignment for stigmators in an electron microscope.
Figure 13:
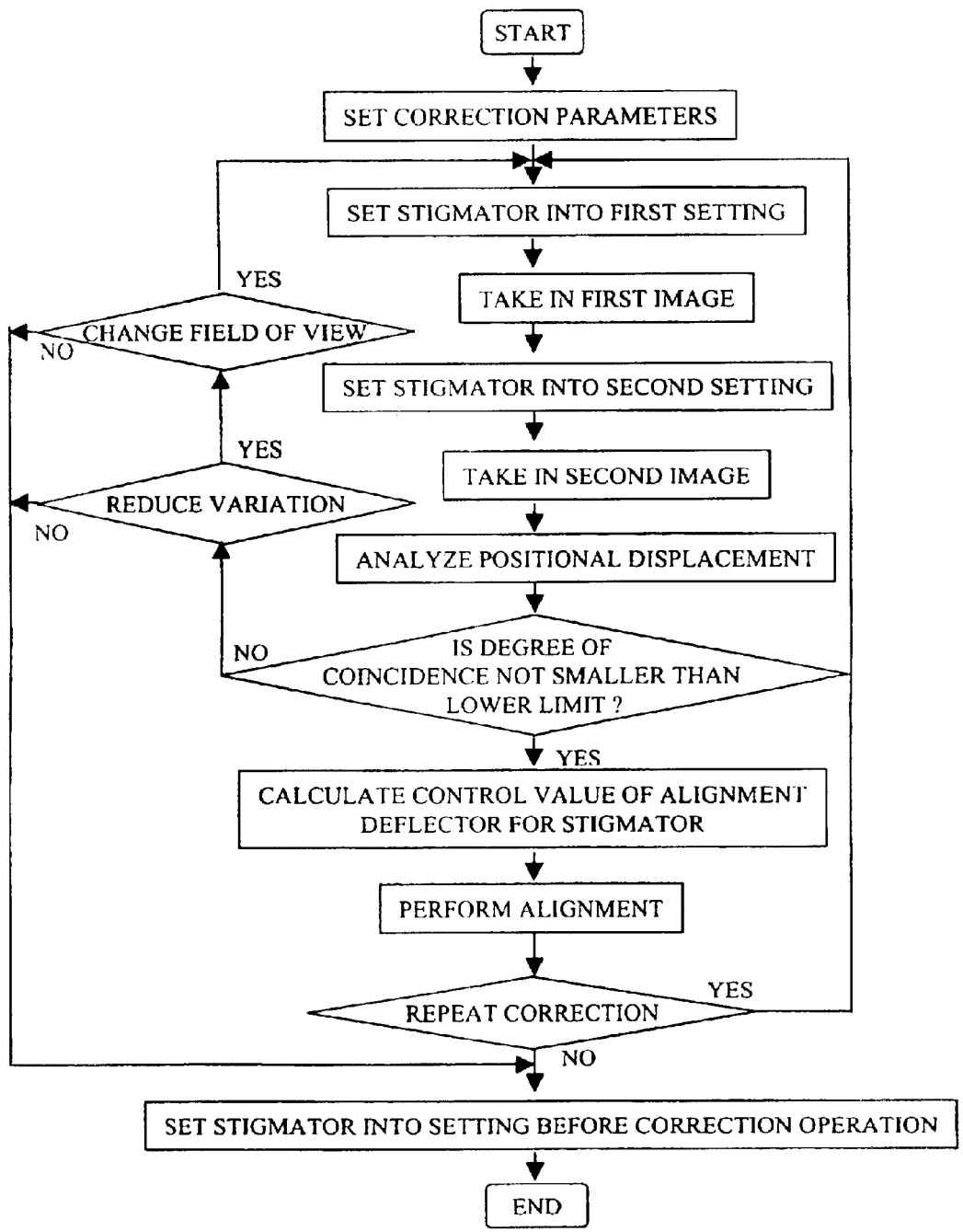
FIG. 13 is a view showing a basic configuration of an automatic alignment unit for stigmators in an electron microscope.

Alignment is required not only for the objective lens but also for stigmators. Since a plurality of stigmators are provided, images before and after the control value of each stigmator is varied are acquired, and the control value of an alignment deflector corresponding to the stigmator is adjusted so that the positional displacement between the images becomes substantially zero. FIG. 12 shows a basic configuration of an automatic alignment unit for a stigmator 14_1, and FIG. 13 shows a correction flow chart thereof. Alignment for the other stigmator 14_2 is also executed by a similar unit and a similar flow. After the field of view, the magnification, and so on, are established, correction parameters such as the control value variations of the stigmators are inputted on a screen similar to those of FIGS. 9A and 9B. Then, if the correction execution button is clicked, correction is started. A first image with the control value of the stigmator 14_1 in the first setting is picked up. The control value of the stigmator 14_1 is varied into the second setting. Then, a second image is picked up. The computer 23 performs such control. In addition, the computer 23 calculates the positional displacement and the degree of coincidence between the first and second images in a displacement analysis method using phase difference of Fourier transform images; judges whether alignment should be carried out or not on the basis of the degree of coincidence; and calculates a control value $(I_{STEIGX\_x}, I_{STIGX\_y})$ of the alignment deflector 15_1 for the first staigmator 14_1 required for making the positional displacement $(D_x, D_y)$ be substantially zero. Thus, alignment is carried out. This calculation is also carried out by use of conversion coefficients or correction items estimated on the basis of measurement of the relationship between the control value variation $\delta I_{STEIGX}$ of the alignment deflector 15_1 for the stigmator and the positional displacement D in advance.

Next, description will be made about focus correction. As a focus correction method, there is an analysis method using parallactic displacement; an analysis method using sharpness of an image as an evaluation criterion; or an analysis method based on comparison of Fourier transform images and simulation images of primary electron beam intensity distribution. The analysis method based on parallax is used in a transmission electron microscope or the like. In the case where the deflection fulcrum of the deflector substantially agrees with the in-focus plane, when a specimen is located in the in-focus plane, there is no shift between the images even if the axial displacement of the primary electron beam is varied. If the specimen is out of the in-focus plane, there occurs a shift between the images before and after the axial displacement of the primary electron beam is varied. On the assumption that $\delta \alpha$ designates the axial displacement variation of the primary electron beam, M designates the magnification, and Cs designates the spherical aberration coefficient, the positional displacement D between the images and the focal displacement F have a relation of $D = M \cdot \delta \alpha (F + Cs \cdot \delta \alpha^2)$. If the positional displacement D based on parallax can be measured, the focal displacement F can be obtained.

However, in the scanning electron microscope, there is a case where the deflection fulcrum of the alignment deflector 16 does not agree with the in-focus plane of the objective lens 19. A focus analysis method in such a case will be described with reference to FIG. 14. A first image with the control value of the alignment deflector 16 in the first setting and a second image with the control value of the alignment deflector 16 in the second setting are acquired in a first focal displacement $F_1$. A first positional displacement $D_1$ between the first image and the second image is analyzed. On the assumption that $\delta \alpha$ designates the axial displacement variation of the primary electron beam, M designates the magnification, and Cs designates the spherical aberration coefficient, the positional displacement $D_1$ and the focal displacement $F_1$ have a relation of $D_1 = M \cdot \delta \alpha (S + F_1 + Cs \cdot \delta \alpha^2)$. S is a term of image shift produced because the deflection fulcrum does not agree with the in-focus plane. Next, a third image with the control value of the alignment deflector 16 in the third setting and a fourth image with the control value of the alignment deflector 16 in the fourth setting are acquired in a focal displacement $F_1 + \delta F$. A positional displacement between the third image and the fourth image is calculated. The positional displacement is expressed by $D_1 + \delta D = M \cdot \delta \alpha (S + F_1 + \delta F + Cs \cdot \delta \alpha^2)$. Thus, the difference $\delta F$ from the first focal displacement $F_1$ can be obtained from the difference $\delta D$ from the first positional displacement $D_1$. The computer 23 calculates the difference $\delta F$ of the focal displacement from the difference $\delta D$ of the positional displacement, obtains an objective control value variation $\delta I_{OBJ}$ required for setting the focus into $F_1$, and corrects the objective lens 19 on the basis of the control value variation $\delta I_{OBJ}$. Thus, even if the deflection fulcrum of the alignment deflector 16 does not agree with the in-focus plane of the objective lens 19, correction can be made to keep the focal displacement constant on the specimen.

The analysis method based on sharpness is a method also used for astigmatism analysis as well as focus analysis, but the method has specimen dependency. In addition, the method is a so-called asymptotic method in which various astigmatic/focal conditions are compared. Therefore, there is a problem that it takes much time to collect sharpness conditions. In addition, the analysis method based on Fourier transform images is also a method used for astigmatism analysis as well as focus analysis, but the specimen dependency is very large. Therefore, there is a problem that the method does not operate in a general field of view for photography. In addition, there is a problem that it takes much time for fitting to simulation though the number of images used for analysis is small. On the other hand, the analysis method based on parallax has a problem that the in-focus plane has to be specified as described previously, but the whole of the field of view can be set into the same focal conditions. In addition, the method is the lowest in specimen dependency, and can make analysis with two images. Thus, the method can carry out analysis at a high speed. From the above-mentioned consideration, it is the most efficient that the analysis method based on sharpness or Fourier transform images is used for specifying the in-focus plane using a specimen for adjusting an optics and for astigmatic correction, while the analysis method using parallax is used for fine adjustment of focus in each field of view for photography.

Figure 16:
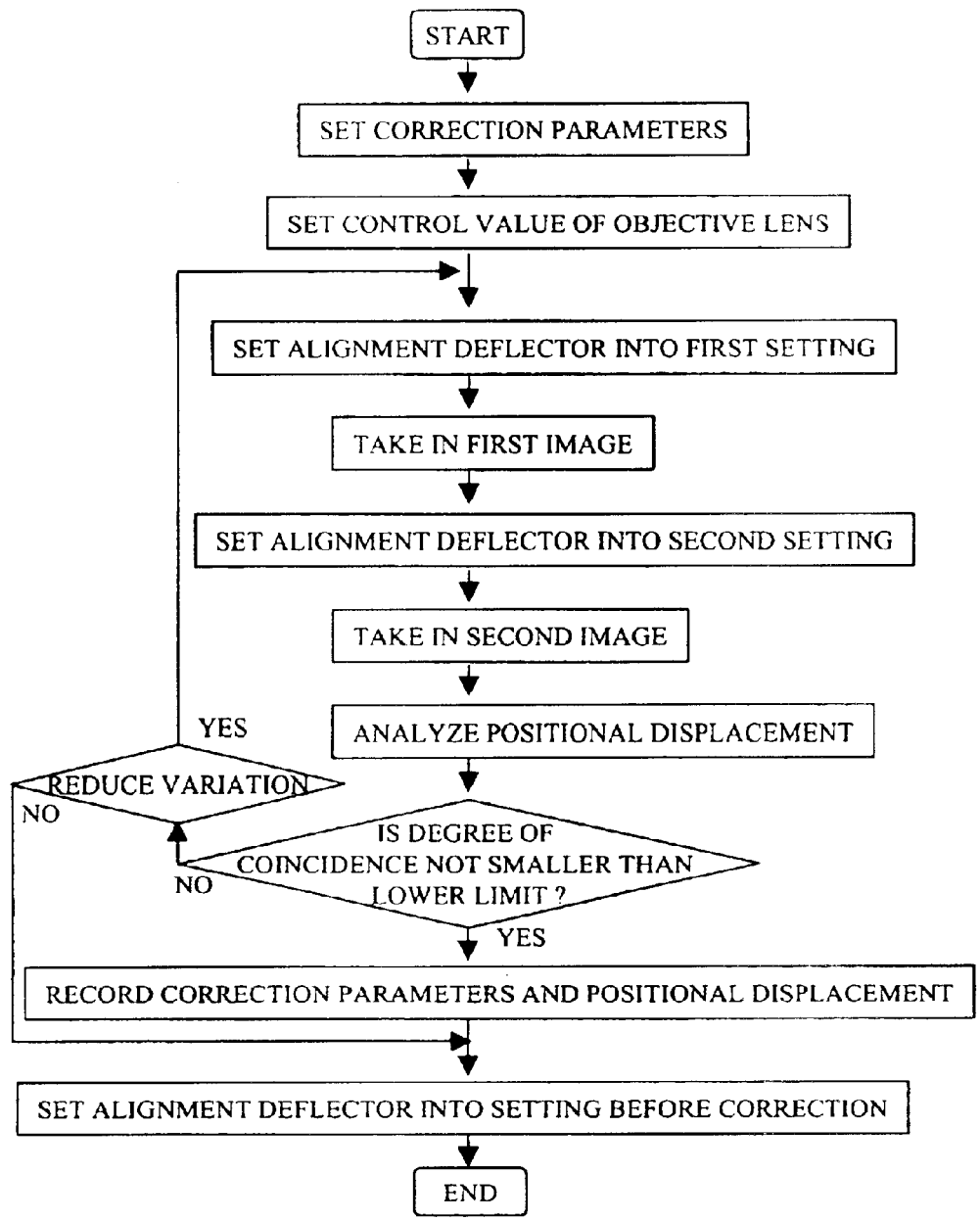
FIG. 16 is a flow chart showing the step of analyzing and recording a positional displacement between images caused by the variation of a control value of an alignment deflector.

FIG. 15 shows a basic configuration of an automatic focus correction unit for an objective lens using parallax. First, a positional displacement $D_1$ in the in-focus plane is analyzed and recorded along the flow chart shown in FIG. 16. The field of view for adjusting an electron beam optics, the magnification, and so on, are established. The control value of the objective lens 19 is set into a value specified in a correction method based on sharpness or Fourier transform, or a value specified by an operator. Correction parameters such as the control value variation of the alignment deflector 16 or the like are inputted on a screen shown in FIG. 17A or 17B. Then, if the recording button is clicked, analysis of the positional displacement $D_1$ in the in-focus plane is started. A first image with the control value of the alignment deflector 16 in the first setting is picked up, and the control value of the alignment deflector 16 is varied into the second setting so that a second image is picked up. The positional displacement and the degree of coincidence between the first and second images are calculated in a displacement analysis method using phase difference of Fourier transform images. If the degree of coincidence is not lower than a lower limit, the displacement analysis result and the apparatus parameters at that time are recorded. Incidentally, for example, when it is intended not to optimize the correction parameters and not to record the positional displacement D, a measurement execution button is clicked. When the measurement execution button is clicked, only the analysis of the positional displacement $D_1$ is carried out without recording it into a memory.

Figure 18:
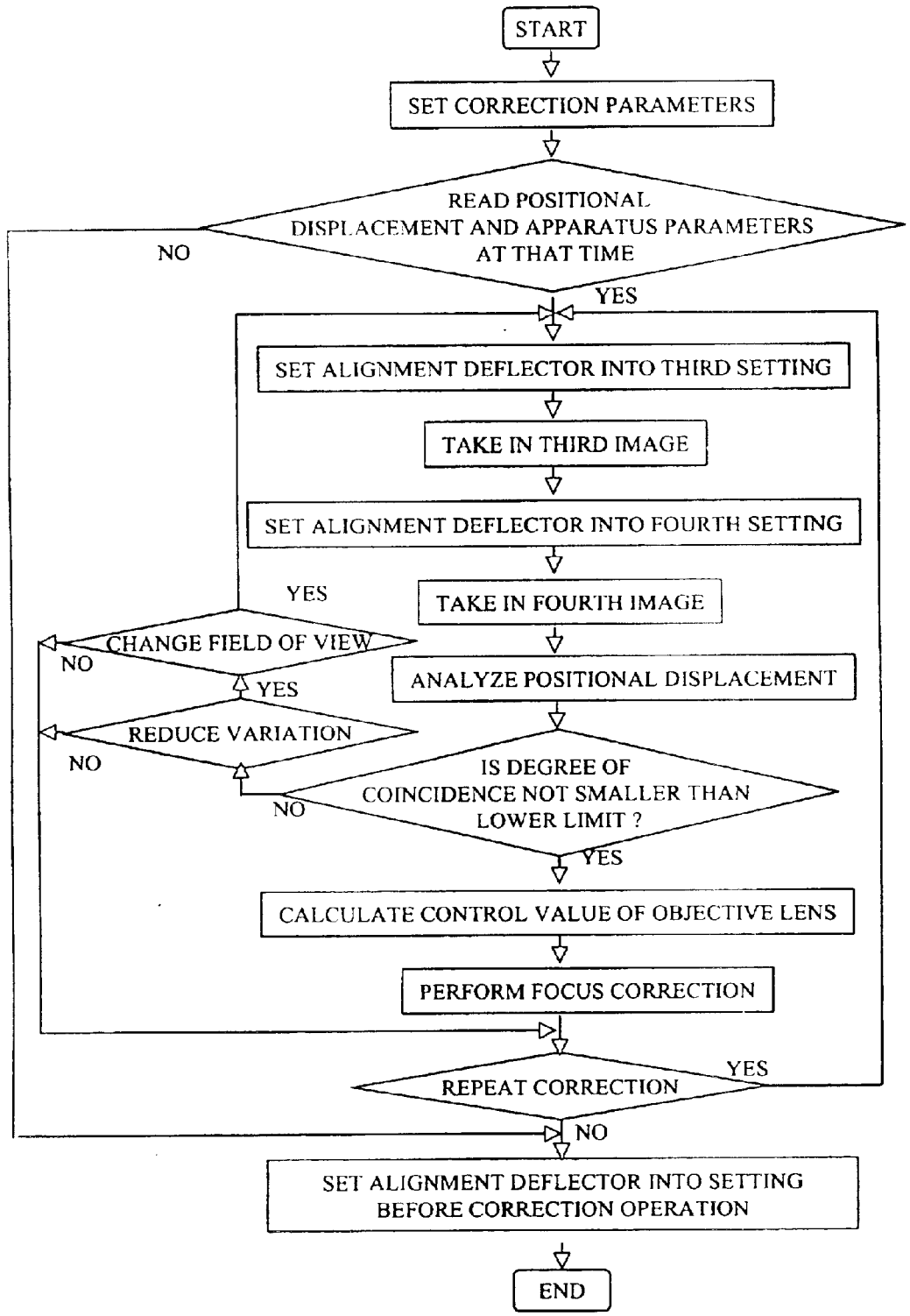
FIG. 18 is a flow chart showing the step of automatic focus correction in an electron microscope.

Automatic focus correction is carried out along the flow chart of FIG. 18. The field of view, the magnification, and so on, are set, and the correction parameters such as the control value variation of the alignment deflector 16 or the like are inputted on the screen shown in FIG. 17A or 17B. Then, if the execution button is clicked, focus correction is started. The positional displacement $D_1$ and the apparatus parameters when the positional displacement $D_1$ was recorded are read out. If the positional displacement $D_1$ has not been recorded, an error message is displayed, and the correction is interrupted. Next, a third image with the control value of the alignment deflector 16 in the third setting is picked up, and the control value of the alignment deflector 16 is varied into the fourth setting so that a fourth image is picked up. The computer 23 performs such control. In addition, the computer 23 calculates a positional displacement and a degree of coincidence between the third and fourth images in a displacement analysis method using phase difference of Fourier transform images; judges whether alignment should be carried out or not on the basis of the degree of coincidence; calculates the control value of the objective lens 19 required for making the positional displacement D substantially $D_1$. Thus, the focus is corrected. Incidentally, there is a case where it is intended to examine the focal displacement or optimize the correction parameters. In such a case, when the measurement execution button is clicked, only focal displacement analysis is carried out without correcting the objective lens 19.

The calculation of the control value variation of the objective lens 19 in the focus correction is also carried out by use of conversion coefficients or necessary correction items estimated on the basis of measurement of the relationship between the control value variation $\delta I_{OBJ}$ of the objective lens 19 and the positional displacement variation $\delta D$ in advance. When the control value of the alignment deflector 16 is varied by $\delta I_{AL\_m2}$ at the magnification $M_{m2}$, a positional displacement $D_0=(D_{x\_0}, D_{y\_0})$ between images in the control value $I_{OBJ\_0}$ of the objective lens 19 is analyzed, and a difference $\delta D_{m2}=(dD_{m2\_x}, dD_{m2\_y})$ from the positional displacement between images in the control value $I_{OBJ\_0}+dI_{OBJ\_m2}$ of the objective lens 19 is obtained. In the focal displacement correction, the absolute value of the positional displacement and the sign of the focal displacement corresponding to the Z direction are used. Therefore, θ correction of the positional displacement D based on the objective lens current value $I_{OBJ}$ is omitted, and only a value $dD_{m2}'$ corrected only by the length $\delta D_{m2}$ is calculated. When the control value of the objective lens 19 is varied by $\delta I_{OBJ}$ in the magnification M, assume that the difference from the positional displacement $D_1$ is $\delta D$. In this case, the control value variation $\delta I_{OBJ}$ of the objective lens 19 required for canceling the positional displacement $\delta D$ is described as $\pm (M_{m2}\cdot \delta I_{AL\_m2} / M \cdot \delta I_{AL}) \cdot \delta I_{OBJ\_m2} \cdot |dD'|/|dD_{m2}'|$. Here, $\delta D'$ designates a value obtained by correcting $\delta D$ with the control value $I_{OBJ}$ of the objective lens 19.

Image indistinctness is caused by deterioration of the conditions of a specimen such as electrification of the specimen, contamination adhering to the specimen, or the like, as well as insufficient adjustment of an electron beam optics such as focal displacement, or the like. If the focal displacement is explicitly shown together with the degree of coincidence as the analysis result as shown in FIGS. 17A and 17B, confirmation can be made as to whether different specimens are observed in the same optical conditions. In addition, since the same optical conditions can be established, the cause of image indistinctness can be specified, and measures can be taken.

Figure 19:
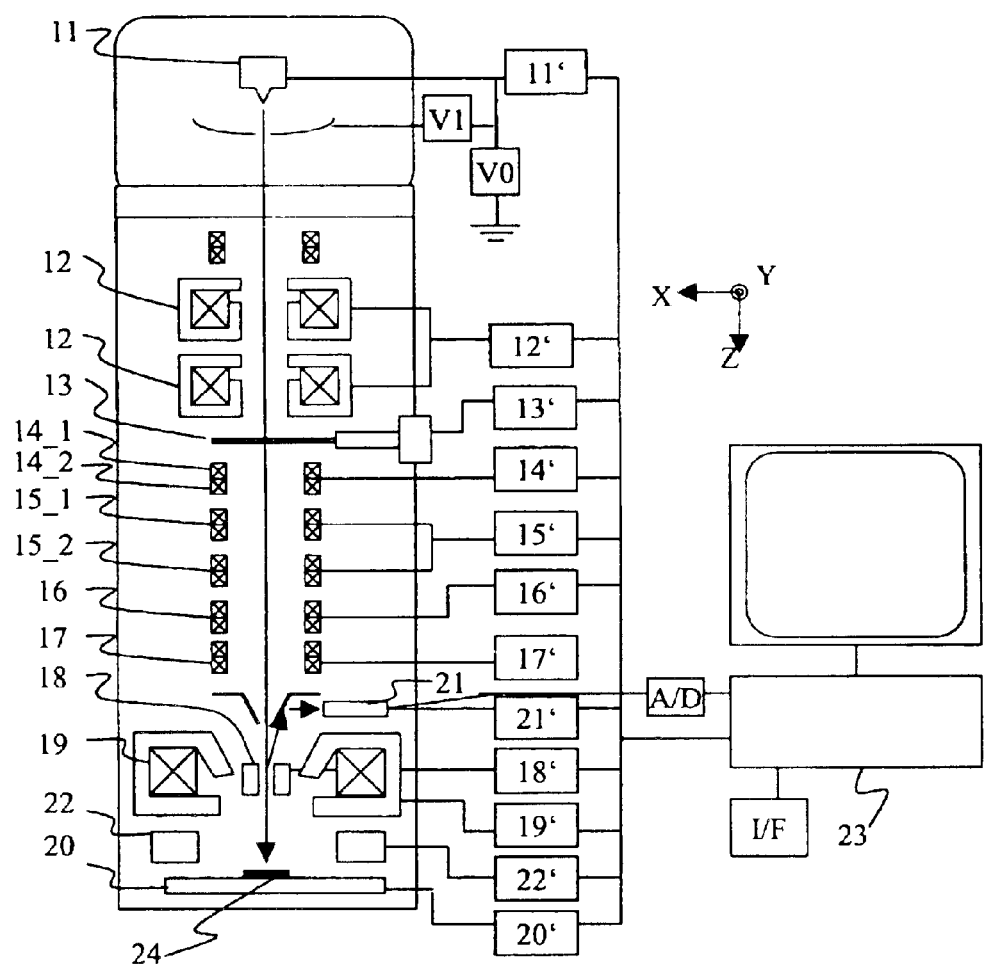
FIG. 19 is a view showing a basic configuration of a scanning electron microscope.
Figure 20:
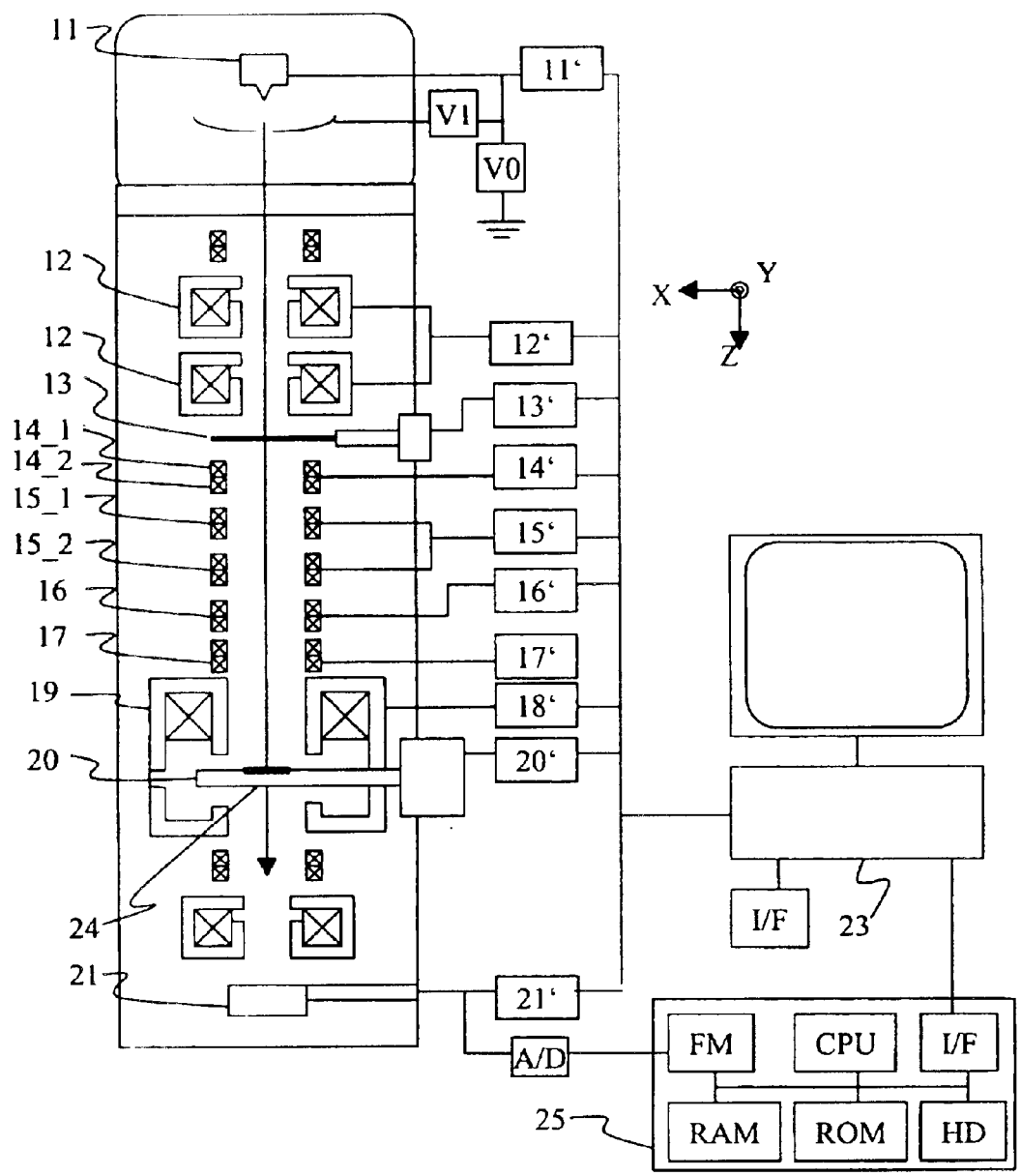
FIG. 20 is a view showing a basic configuration of a scanning transmission electron microscope.

Incidentally, the present invention relates to the adjustment of a primary electron beam which has not yet been incident to a specimen. The invention is also applicable to the case where an electron beam detector 21 for detecting a secondary electron beam is disposed between an objective lens 19 and an electron source 11 as shown in FIG. 19, or the case where an electron beam detector 21 is disposed in front of a specimen 24 in the Z direction as shown in FIG. 20. In addition, the invention is also applicable to optical adjustment in a charged particle beam other than an electron beam, for example, in a focused ion beam.

(Embodiment 2)

Figure 22:
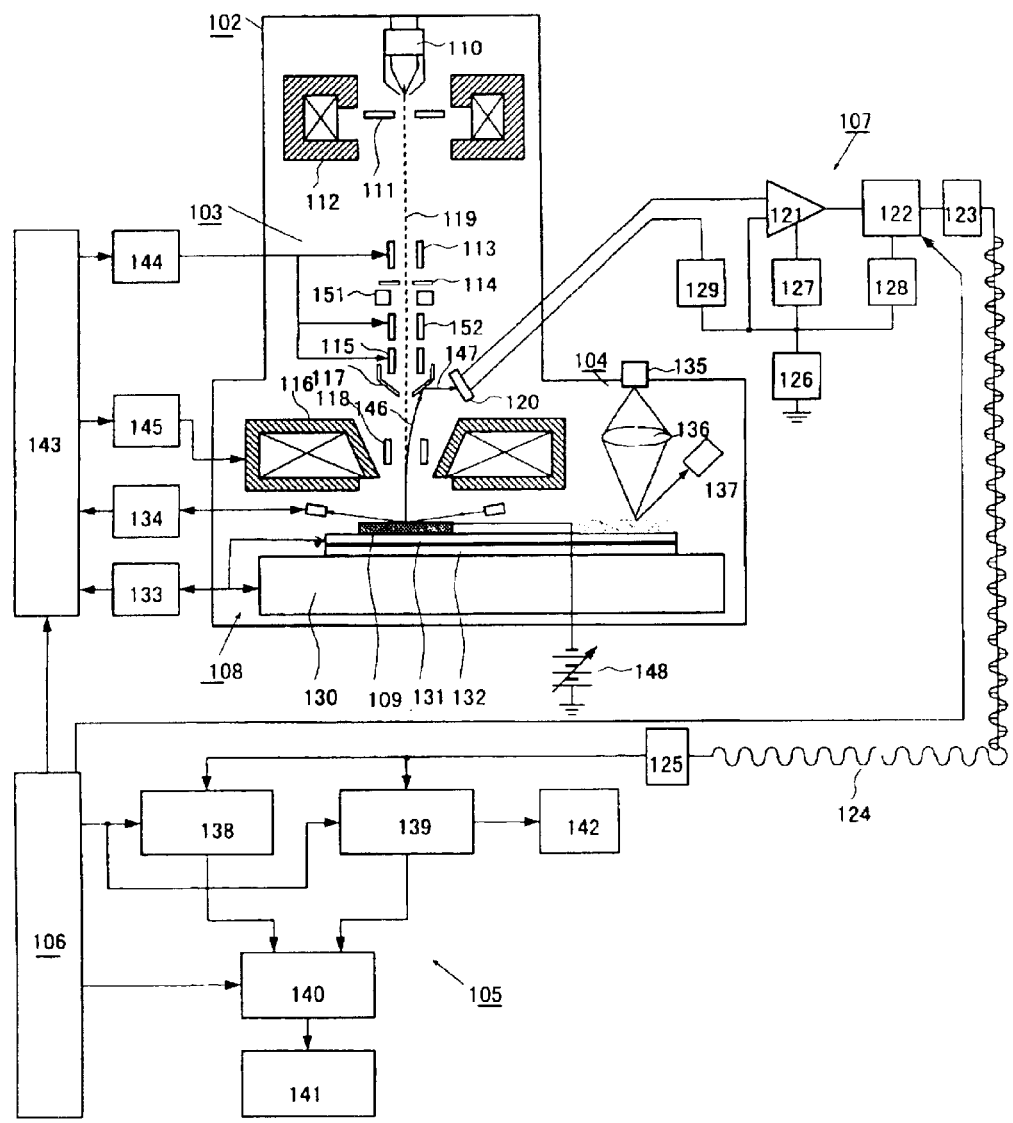
FIG. 22 is a view showing a configuration of a circuit pattern inspection apparatus.

In Embodiment 2, description will be made about a circuit pattern inspection apparatus having an automatic adjustment unit shown in Embodiment 1. FIG. 22 shows a configuration of the circuit pattern inspection apparatus used in Embodiment 2. The circuit pattern inspection apparatus has an inspection chamber 102 the inside of which is vacuum-pumped, and a spare chamber (not shown in this embodiment) for carrying a specimen substrate 109 into the inspection chamber 102. This spare chamber can be vacuum-pumped independently of the inspection chamber 102. In addition, the circuit pattern inspection apparatus is constituted by a control unit 106 and an image processing unit 105 as well as the inspection chamber 102 and the spare chamber. The inside of the inspection chamber 102 is roughly constituted by an electron beam optics 103, a secondary electron detector 107, a specimen chamber 108, and an optical microscope unit 104. The optical microscope unit 104 is disposed near the electron beam optics 103 inside the inspection chamber 102 and in a position distant enough not to affect each other. The distance between the electron beam optics 103 and the optical microscope unit 104 is known. Then, an X stage 131 or a Y stage 132 is designed to reciprocate the known distance between the electron beam optics 103 and the optical microscope unit 104.

In order to acquire an image of the inspected substrate 109, the inspected substrate 109 is irradiated with a primary electron beam 119 which has been narrowed, so that a secondary electrons 146 are produced. These electrons are detected in synchronism with scanning with the primary electron beam 119 and the movement of the X-Y stages 131 and 132. Thus, an electron beam image on the surface of the inspected substrate 109 is obtained. The circuit pattern inspection apparatus in this embodiment is provided with a function to detect a signal at the time of scanning only once with an electron beam with a large control value of, for example, 100 nA which is generally about 100 times or more as large as SEM, so as to form an image. When the scanning width is 100 $\mu$m and the size of one pixel is 0.1 $\mu$m□, scanning at one time can be performed in 1 $\mu$s.

A diffuse supply type thermal field emission electron source is used as an electron gun 110. By use of this electron gun 110, a stable electron beam current can be ensured in comparison with a conventional one such as a tungsten (W) filament electron source or a cold field emission electron source. Therefore, not only is it possible to obtain an electron beam image low in brightness fluctuation, but it is also possible to set the electron beam current to be large. As a result, it is possible to realize high-speed inspection in which a high S/N electron beam image is formed by scanning at one time. The primary electron beam 119 is extracted from the electron gun 110 by applying a voltage between the electron gun 110 and an electron extraction electrode 111. The primary electron beam 119 is accelerated by applying a high voltage and negative potential to the electron gun 110. Thus, the primary electron beam 119 travels toward a specimen base 130 by energy corresponding to the potential. The primary electron beam 119 is condensed by a condenser lens 112, and further narrowed by an objective lens 116. Then, the inspected substrate 109 (semiconductor wafer, chip, or substrate with a micro circuit pattern such as liquid crystal, a mask, or the like) mounted on the X-Y stages 131 and 132 on the specimen base 130 is irradiated with the narrowed primary electron beam 119. Incidentally, a signal generator 144 for generating a scanning signal, a correction signal and a blanking signal is connected to a blanking deflector 113, an alignment deflector 152 and a scanning deflector 115. Lens power supplies 145 are connected to the condenser lens 112 and the objective lens 116 respectively. A negative voltage can be applied to the inspected substrate 109 by a high voltage power supply 148. By adjusting the voltage of the high voltage power supply 148, the primary electron beam 119 is decelerated so that the electron beam irradiation energy to the inspected substrate 109 can be adjusted to be an optimum value without changing the potential of the electron gun 110.

The secondary electrons 146 generated by irradiating the inspected substrate 109 with the primary electron beam 119 are accelerated by the negative voltage applied to the substrate 109. An ExB deflector 118 is disposed above the inspected substrate 109 so as to deflect the accelerated secondary electrons 146 in a predetermined direction. The degree of deflection can be adjusted by the intensity of a voltage and the intensity of a magnetic field applied to the ExB deflector 118. In addition, this electromagnetic field can be varied in connection with the negative voltage applied to the specimen. The secondary electrons 146 deflected by the ExB deflector 118 collide against a converter electrode 117 on predetermined conditions. When the accelerated secondary electrons 146 collide against the converter electrode 117, second secondary electrons 147 having energy in a range of from several V to 50 eV are generated from the converter electrode 117.

The secondary electron detector 107 is constituted by a secondary electron detector 120 inside the vacuum-pumped inspection chamber 102, a preamplifier 121, an AD converter 122, a light convert system 123, a transmission system 124, an electron convert system 125, a high voltage power supply 126, a preamplifier power supply 127, an AD converter power supply 128 and a reverse bias power supply 129 outside the inspection chamber 102. In the secondary electron detector 107, the secondary electron detector 120 is disposed above the objective lens 116 in the inspection chamber 102. The secondary electron detector 120, the preamplifier 121, the AD converter 122, the light convert system 123, the preamplifier power supply 127 and the AD converter power supply 128 are floated to positive potential by the high voltage power supply 126. The second secondary electrons 147 generated when the secondary electrons 146 collide against the converter electrode 117 are guided to the detector 120 by this suction electric field. The secondary electron detector 120 is designed to detect the second secondary electrons 147 in connection with the scanning timing of the primary electron beam 119. The second secondary electrons 147 are generated in such a manner that the secondary electrons 146 generated while the inspected substrate 109 is irradiated with the primary electron beam 119 are accelerated to collide against the converter electrode 117. An output signal of the secondary electron detector 120 is amplified by the preamplifier 121 disposed outside the inspection chamber 102, and converted into digital data by the AD converter 122. The AD converter 122 converts an analog signal detected by the semiconductor detector 120 into a digital signal immediately after the analog signal is amplified by the preamplifier 121. Then, the AD converter 122 transmits the digital signal to the image processing unit 105. Since the detected analog signal is digitized and transmitted immediately after it is detected, a signal higher in speed and higher in S/N ratio than that in a conventional apparatus can be obtained.

The inspected substrate 109 is mounted on the X-Y stages 131 and 132 so as to select either one of a method in which the X-Y stages 131 and 132 are made to stand still at the time of execution of inspection so that the primary electron beam 119 is scanned two-dimensionally and a method in which the X-Y stages 131 and 132 are moved continuously in the Y direction at a fixed speed at the time of execution of inspection so that the primary electron beam 119 is scanned linearly in the X direction. When a specified, comparatively small area is inspected, the former method for inspection while the stages are made to stand still is effective. When a comparatively large area is inspected, the method for inspection while the stages are moved continuously at a fixed speed is effective. Incidentally, when it is necessary to blank the primary electron beam 119, the primary electron beam 119 is deflected by the blanking deflector 113 so that any electron beam can be controlled not to pass through an aperture 114. Thus, any electron beam unnecessary for inspection is controlled not to irradiate the specimen, so that the inspected substrate 109 can be restrained from being electrified.

A measurement machine based on laser interference is used as a measurement unit 133 for position monitoring in this embodiment. Thus, the position of the X stage 131 and the position of the Y stage 132 can be monitored in real time so as to be transmitted to the control unit 106. In addition, various data of the X stage 131 and the Y stage 132 are designed to be transmitted to the control unit 106 through the corresponding drivers in the similar manner. On the basis of such data, the control unit 106 can grasp an area or a position irradiated with the primary electron beam 119. Thus, in accordance with necessity, the positional displacement of the irradiation position of the primary electron beam 119 is corrected by a corrector control unit 143 in real time. In addition, the area irradiated with the electron beam can be stored for every inspected substrate.

An optical sensor using a measuring system other than an electron beam, for example, a laser interference sensor or a reflection type sensor for measuring a variation in height of a specimen by the position of reflected light, is used as an optical height sensor 134. The optical height sensor 134 is designed to measure the height of the inspected substrate 109 mounted on the X-Y stages 131 and 132 in real time. In this embodiment, the following system is adopted. That is, the inspected substrate 109 is irradiated, through a transparent window, with narrow white light passing through a slit. The position of reflected light is detected by a position detection monitor, and a variation of height is calculated from the fluctuation of the detected position. The focal length of the objective lens 116 for narrowing the primary electron beam 119 on the inspected substrate 109 can be grasped on the basis of the data measured by the optical height sensor 134. Thus, an electron beam image which is in focus to some extent can be acquired as soon as the inspected substrate is loaded in the inspection chamber 102. In addition, the following function is also given to the optical height sensor 134. That is, the warp, the height or the distortion of the inspected substrate 109 is measured in advance before irradiation with the electron beam. Correction conditions for every inspection area of the objective lens 116 can be set on the basis of the measured data.

The image processing unit 105 is constituted by a first image memory unit 138, a second image memory unit 139, a compare operation unit 140, a defect recognizing unit 141, and a monitor 142. An image signal of the inspected substrate 109 detected by the secondary electron detector 120 is amplified by the preamplifier 121, and digitized by the AD converter 122. Then, the digitized signal is converted into a light signal by the light convert system 123, transmitted through an optical fiber 124, and converted into an electric signal again by the electron convert system 125. Then, the electric signal is stored in the first image memory unit 138 or the second image memory unit 139 in accordance with an instruction from the control unit 106. Image signals stored in these two memory units are sent to the compare operation unit 140 in accordance with an instruction from the control unit 106. The compare operation unit 140 gives the respective image signals various image processing for positioning the image signals, standardizing the signal level, and eliminating noise signals, and carries out compare operation on the image signals of both the memory units. The defect recognizing unit 141 compares the absolute value of an intensity difference image signal subjected to the compare operation in the compare operation unit 140, with a predetermined threshold value. If the intensity difference image signal level is larger than the predetermined threshold value, a pixel corresponding thereto is recognized as a defect candidate. In accordance with an instruction from the control unit 106, the monitor 142 displays the positions of pixels recognized as defects by the defect recognizing unit 141, the total number of the detected defects, and so on, in real time during the inspection, or displays image data stored in the first or second memory unit 138 or 139.

Description has been made above about the whole configuration of the circuit pattern inspection apparatus. Next, description will be made about an inspection method using a semiconductor wafer by way of example. In the circuit pattern inspection for a semiconductor wafer, irradiation energy of a primary electron beam 119 irradiating a specimen is desirably adjusted and controlled so that the state of electrification is varied to adjust the contrast. In this embodiment, a negative voltage for decelerating primary electrons is applied from a retarding power supply 148. This voltage is controlled to adjust the irradiation energy of the primary electron beam 119 suitably. For example, when the electron beam accelerating voltage of the inspection apparatus is set to 10 kV and the negative voltage applied to a specimen and a specimen base is set to −9 kV, the energy of the primary electron beam 119 irradiating the specimen becomes 1 kV. FIG. 23 shows an example of a condition list of electron beam irradiation energy in accordance with the material and the step of the inspected circuit pattern, and an example of a condition list of electron beam irradiation energy in accordance with defects to be detected. When the step is high, the irradiation energy is set high (not lower than 1 kV). When the step is low or absent, the irradiation energy is set low (not higher than 3 kV). Moreover, in the combination of a conductive material and an insulating material, contrast can be obtained regardless of the level of the irradiation energy. However, in the combination of an insulating material and an insulating material, contrast is obtained by the difference of charged conditions between the respective materials while setting the irradiation energy to be not lower than 1 kV. Further, when it is intended to detect a shape defect, the irradiation energy has to be set to be not lower than 500 V, preferably not lower than 1 kV. When it is intended to detect a potential contrast defect, that is, an electric defect such as failure in electric continuity, short-circuit, or the like, the irradiation energy has to be set to be not higher than 3 kV, preferably not higher than 1 kV. Since there are various materials and steps in inspected circuit patterns, irradiation energy suitable for each of the circuit patterns is inputted in a data base in advance so that irradiation energy suitable for each inspection can be retrieved.

Figure 24:
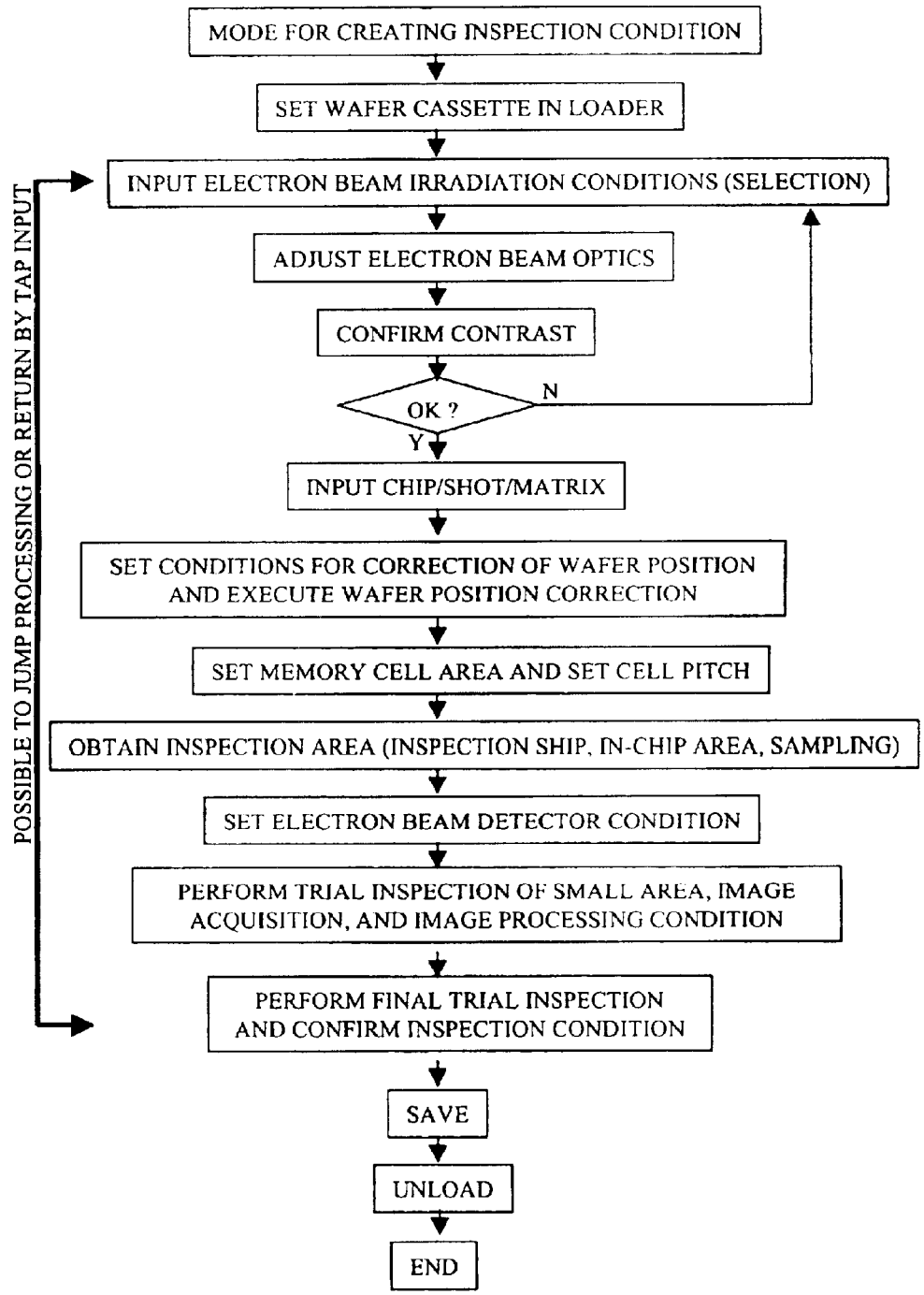
FIG. 24 is a flow chart for explaining the flow for establishing inspection conditions.

The inspection conditions are established along the flow chart shown in FIG. 24. First, a mode for creating the inspection conditions is selected on an operation screen, and a semiconductor wafer 109 is really loaded into the inspection apparatus. Irradiation energy optimal for every circuit pattern inspection is set with reference to the data base. When a negative voltage is applied to the specimen base in order to set the irradiation energy, the electromagnetic field states are varied. Therefore, an electron beam optics for focus, astigmatism, etc., has to be finely adjusted for every irradiation energy. Such electron beam optics adjustment is performed by use of a specimen for adjusting the electron beam optics. The electron beam optics adjusting specimen is pasted onto the specimen base. The stage is moved to the place of the electron beam optics adjusting specimen. First, axial displacement is analyzed in an analysis method using parallax (see FIG. 4), and the axial displacement is automatically corrected by a deflector 152 for alignment. A setting range of the axial displacement is inputted. If the axial displacement is so large that sufficient correction cannot be done at one time, correction is carried out repeatedly till the axial displacement is put in the setting range. After confirmation is made that the axial displacement has been in the setting range, focus/astigmatism is analyzed in an analysis method using sharpness of images as criteria or an analysis method based on comparison between Fourier transform images and simulation images of the images, so as to correct an objective lens 116 and a stigmator 151. Also at this time, a setting range of focus/astigmatism is inputted, and correction is carried out again if sufficient correction has not been done. After the adjustment of the electron beam optics, the setting values of the lenses and the deflectors are recorded respectively. In addition, a positional displacement $D_1$, a magnification and a value $\delta I_{AL}$ when the setting value of the deflector 152 for alignment is varied by the value $\delta I_{AL}$ are recorded. In addition, a focus setting range allowable during inspection is also inputted. Incidentally, the electron beam optics adjustment may be carried out in an area for adjustment provided in the inspected semiconductor wafer 109. In addition, manual adjustment can be performed for the case where axial displacement, focus or astigmatism cannot be automatically adjusted.

After the adjustment of the electron beam optics, the inspected semiconductor wafer 109 is irradiated with the primary electron beam 119 so that an image of a circuit pattern to be inspected is confirmed on the monitor. It is also possible to vary the irradiation energy in accordance with necessity while confirming the contrast on the monitor. Incidentally, when the irradiation energy is varied, the electron beam optics has to be readjusted.

When the adjustment of the electron beam optics and the confirmation of the irradiation energy have been completed, a pattern for correcting the position of the semiconductor wafer 109 is set. The shot of the circuit pattern and the chip size and array on the semiconductor wafer are inputted in accordance with necessity. In addition, the coordinates of the correcting pattern on the chip and the offset value of a chip origin are inputted. The specimen stage is moved to the correcting pattern, and the correcting pattern is recorded in a memory as a first image. The image may rotate due to the setting of the irradiation energy and the adjustment of the electron beam optics accompanying the setting. When image rotation is expected to be large, the semiconductor wafer 109 is moved by a specimen stage moving mechanism so that the pattern is not out of the field of view. Then, a second image is acquired. A positional displacement between the acquired images is analyzed, and a displacement angle from the specimen stage moving direction is analyzed. Then, correction is done.

Next, wafer position correction is executed. The specimen stage is moved in parallel by a quantity corresponding to the chip size. Then, the specimen stage is moved to the position of the pattern for correction on two chips arranged in parallel, so that the pattern is acquired as a second image. The positional displacement and the degree of coincidence between the first image and the second image are analyzed in a method using phase difference of Fourier transform images. If the degree of coincidence is not lower than a lower limit, the degree of the specimen stage movement is corrected. When the degree of coincidence is not higher than the lower limit, there is a possibility that the pattern for correction is not reflected on the screen. Therefore, the image take-in magnification is reduced, and a second image is taken in so that the displacement analysis is performed with an image obtained by reducing the recorded first image in the computer. The rotation displacement angle and the degree of movement are measured and corrected. Then, correction is performed again at the magnification for inspection. After the correction is completed, correction parameters in every irradiation energy are recorded.

After that, a repeat pattern area such as a memory cell in the chip is established, and a repeat unit, that is, a pitch is set for the repeat pattern area. Next, an inspected area is specified. When the inspected area is specified, an inspected chip can be specified, and an in-chip inspected area can be specified. As for an area other than the repeat pattern area such as a memory cell or the like, an area to be inspected can be set in an optical microscope image or an electron beam image.

In addition, the gain/offset of the secondary electron beam detector is set for adjustment after the adjustment of the irradiation energy and the electron beam optics. The gain/offset is specified for every irradiation energy so as to allow an electron beam image of the electron beam optics adjusting specimen to have a suitable brightness distribution. The specified gain/offset is recorded. Next, the gain/offset is specified to allow an electron beam image of every inspected pattern to have a suitable brightness distribution. A difference from the gain/offset specified with the electron beam optics adjusting specimen is recorded as a gain/offset table. In addition, a mean value and a variance of the electron beam image intensity of every inspected pattern are recorded, and a setting range of every inspected pattern is also inputted. The mean value and the variance are used for fine adjustment of the gain/offset during the execution of inspection.

If the above-mentioned setting is completed, images are acquired really on various conditions established thus, so that image processing conditions for detecting defects are established. For example, inspection is performed along the following image processing flow. In order to extract defect portions, a first image of a circuit pattern in a quality product is recorded in a memory. An image of a circuit pattern to be inspected in the inspected semiconductor wafer 109 is acquired as a second image. A positional displacement between the first image and the second image is obtained in an analysis method using phase difference of Fourier transform images, so that the positional displacement of the second image is corrected. After the positional displacement is corrected, fine adjustment of contrast between the first image and the second image is performed. Some areas for fine adjustment of contrast are specified in the first image separately from the portions for defect inspection. The contrast of the second image is fine-adjusted so that the image intensities of the areas for fine adjustment of contrast in the images substantially agree with each other. After the fine adjustment of contrast, an intensity difference image between the first image and the second image is calculated. Incidentally, the first image of the inspected circuit pattern may be not an image of a quality product recorded in advance, but an image of an inspected circuit pattern in the inspected wafer. In addition, if the S/N ratios of the first and second images are low, the S/N ratios may be improved by image summation as follows. That is, a plurality of images are acquired from each of corresponding areas, and positional displacement between the images are analyzed and corrected in a displacement analysis method using phase difference of Fourier transform images. After that, image summation is performed to improve the S/N ratios.

An image corresponding to one chip is acquired on the same conditions as those for inspection. A threshold value for distinguishing defects from the others is inputted. Of the above-mentioned intensity difference image, portions recognized as defects are displayed. Confirmation is made as to whether defects are detected really or detected in error. Thus, the threshold value is adjusted to be a suitable value. Finally, in order to take into consideration a margin for process scattering in the wafer plane, a desirable area wider than the above-mentioned area corresponding to one chip is set. Inspection is executed really on various conditions set thus. The contents of detected defects or erroneous detection are confirmed. If the conditions are finally suitable ones, the conditions are registered as an inspection condition file.

Figure 25:
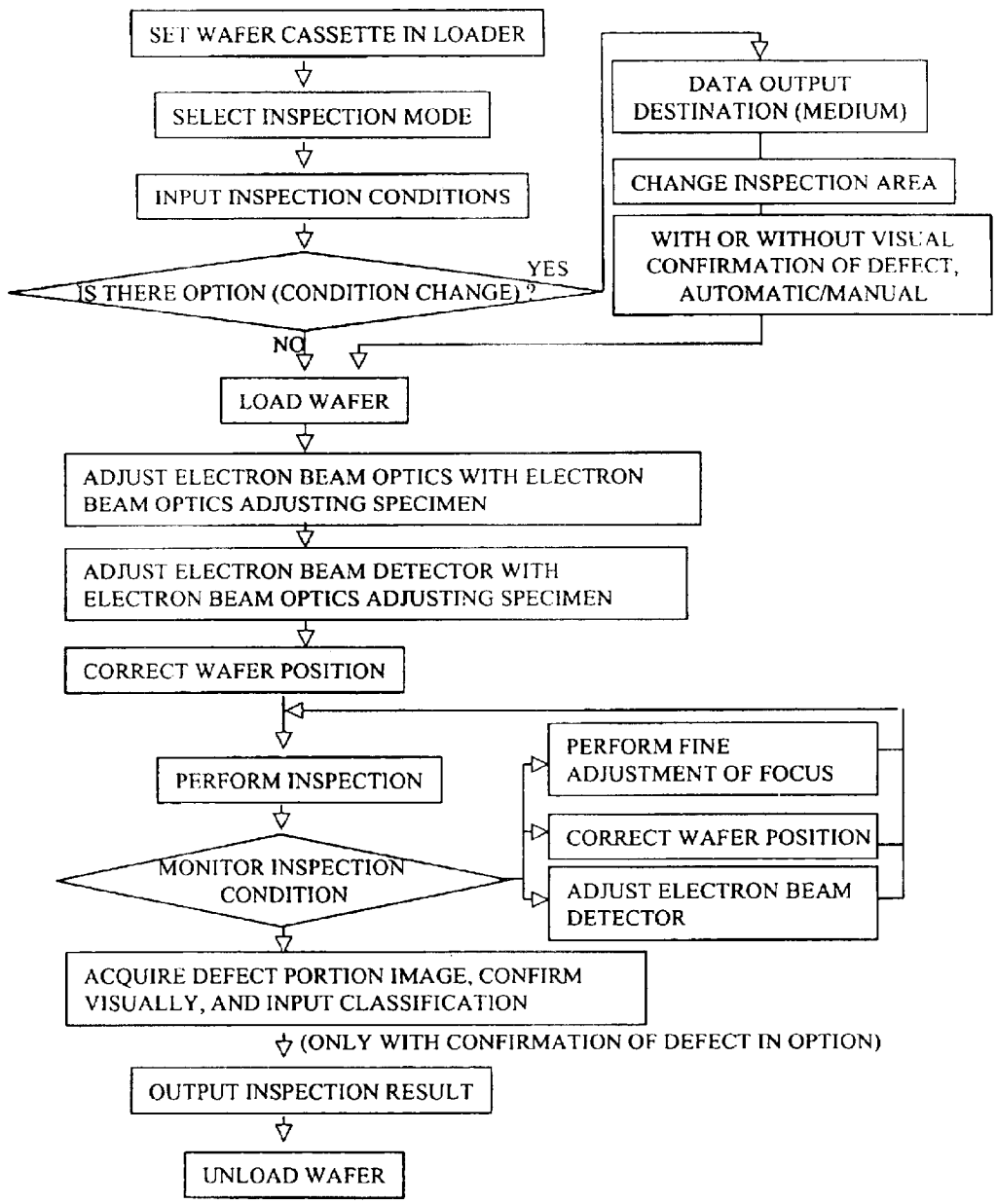
FIG. 25 is a flow chart showing the flow of automatic inspection.

Inspection is executed along the flow chart of FIG. 25. Some inspection condition files have been registered in the computer 23 in accordance with circuit patterns. A necessary file is selected on the screen, and optional conditions such as inspected area, result output, and so on, are inputted. When inspection execution is selected and a wafer is loaded, setting of respective parameters is started. Setting expected to change with passage of the time is readjusted using a recorded setting value as an initial value. First, axial displacement, focus, and astigmatism are corrected by use of a specimen for adjusting an electron beam optics. Confirmation and recording are made that axial displacement, focus, and astigmatism are in their predetermined ranges respectively. After that, a positional displacement $D_1$ in a principal focus is recorded. In addition, a gain/offset optimum value of the electron beam detector in the electron beam optics adjusting specimen is specified. It is necessary to correct the position of the inspected semiconductor wafer.

When adjustment before inspection is completed, inspection of the circuit pattern is started. Some corrections are performed during the inspection. First, the field of view may be displaced due to specimen drift, a stage micromotion error, or the like. In order to correct such a displacement of the field of view, positional displacement adjustment by use of a pattern for correction is performed in some chips in the inspected semiconductor wafer. A second image of the pattern for correction is acquired in a specified chip. A positional displacement from the recorded first image is analyzed in an analysis method using phase difference of Fourier transform images. Thus, the positional displacement and the degree of coincidence are calculated. If the degree of coincidence is not lower than a lower limit, the displacement of the field of view is corrected by the specimen stage or an image shift. When the degree of coincidence is not higher than the lower limit, there is a possibility that the pattern for correction is out of the field of view. Therefore, the image take-in magnification is reduced, and a second image is taken in so that the displacement analysis is performed with an image obtained by reducing the recorded first image in the computer. When the reduction of the magnification is repeated, and the positional displacement cannot be analyzed even at the lowest magnification established, an error message is displayed, and the inspection is interrupted.

In addition, there is a case where the height of the specimen varies during the inspection so that the specimen is displaced from the focus of the objective lens. Thus, an image may be indistinct. In order to correct such a focal displacement, focal displacement correction is executed in some specified portions. A positional displacement between images before and after the control value of the alignment deflector is varied is analyzed in an analysis method using phase difference of Fourier transform images. A control value variation of the objective lens required for making the positional displacement be $D_1$, is obtained, and correction is done (see FIG. 14). After confirmation and recording are made that the focus is in the setting range, inspection is started again. In addition, the degree of indistinctness of an image may be monitored so that focal displacement correction can be executed in optimum correction portions and an optimum number of times. When defective portions are extracted, there are included a large number of steps in which positional displacement between images is analyzed and corrected. In the displacement analysis method using phase difference of Fourier transform images, the displacement analysis result and the degree of coincidence are outputted. By use of this degree of coincidence as an index for image indistinctness, conclusion is made that the image has got indistinct if the degree of coincidence is not higher than a designated value. Then, focus correction is executed.

Incidentally, consideration is made that image indistinctness is also caused by deterioration of the states of a specimen such as electrification of the specimen, contamination adhering to the specimen, or the like, as well as focal displacement. If the inspected semiconductor wafer 109 or the electron beam optics adjusting specimen is continuously irradiated with the primary electron beam 119, the contrast is fluctuated due to the influence of electrification, or contamination adheres to the wafer 109 or the specimen. To restrain such deterioration, the primary electron beam 119 irradiates a blanking plate provided in the middle of the optics by a blanking electrode unless an electron beam image is acquired or inspected. However, electrification or contamination adhesion may occur in some vacuum state in the inspection chamber or in some contamination state of the semiconductor wafer. Although it is difficult to take measures against specimen deterioration in real time during inspection, specification can be made on the basis of the focal displacement analysis result as to whether image indistinctness is caused by focal displacement or not. Recording of focal displacements can be utilized as a data base for optimizing the inspection conditions. On the other hand, the degree of coincidence showing information of image indistinctness can be utilized as a margin for erroneous detection in the detection result. Therefore, the degree of coincidence or the focal displacement analysis result during inspection is preferably recorded.

In addition, gain/offset adjustment of the secondary electron detector may be required due to lowering of the output of the electron source or the like. First, an initial value of gain/offset during inspection is set with reference to the gain/offset table on the basis of the gain/offset in the electron beam optics adjusting specimen. The mean value and the variance of image intensity can be calculated in a comparatively short time. Therefore, the mean value and the variance are utilized for the gain/offset correction during inspection. The mean value and the variance of image intensity are calculated timely, and the gain/offset of the secondary electron detector is corrected so that the mean value and the variance are put in their specified ranges.

Inspection is proceeded with while executing the above-mentioned correction. The contents of defects are confirmed in accordance with necessity. The result is recorded and the wafer is unloaded. Then, the inspection is terminated. Not only recording of defect portions but also recording of conditions of image indistinctness using the degree of coincidence between images, or recordings of various corrections are left in the result of inspection. Erroneously detected areas can be estimated with reference to such recordings. Thus, the reliability of the inspection result can be evaluated and improved.

(Embodiment 3)

Figure 26:
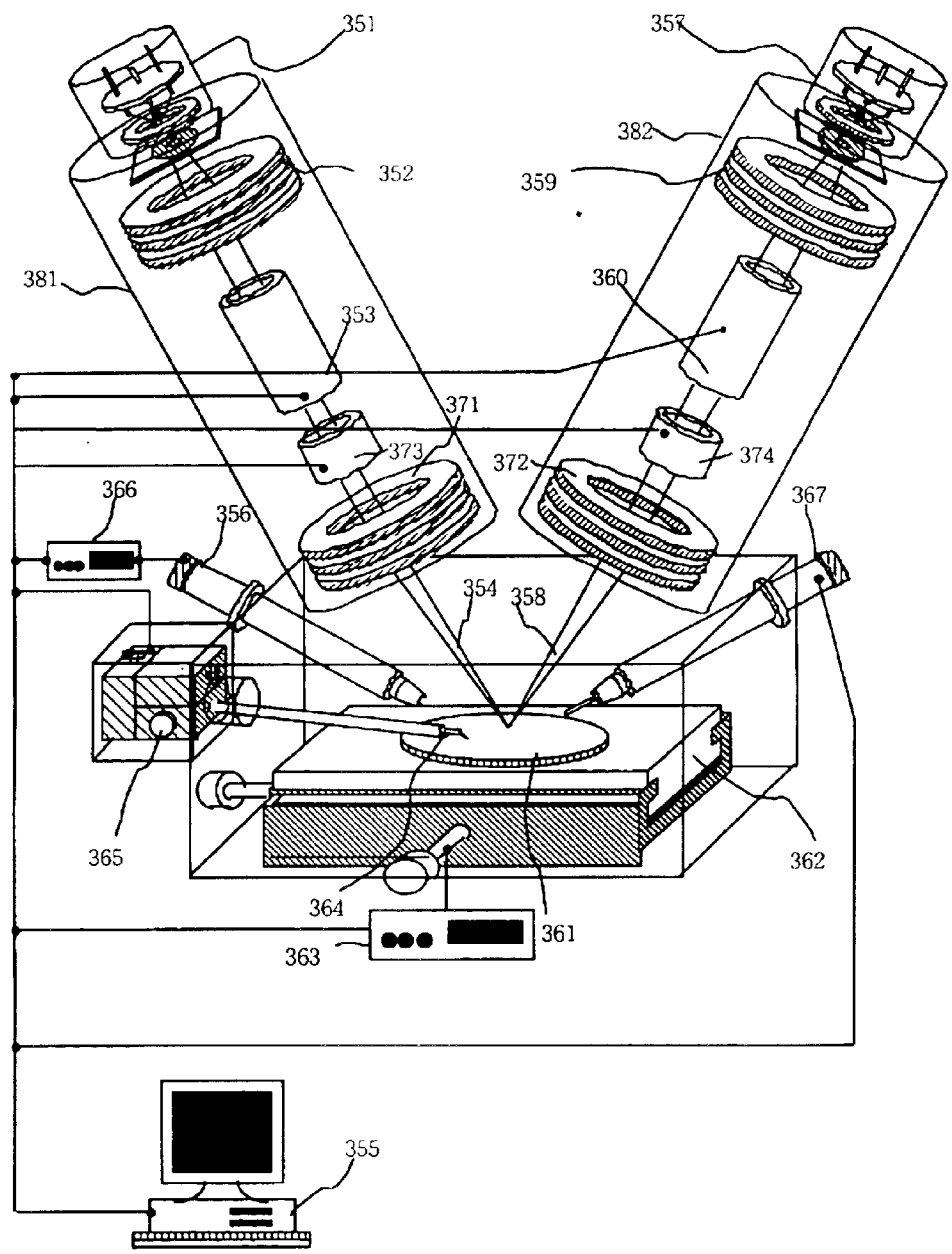
FIG. 26 is a view showing a whole configuration of a specimen observation apparatus in which a focused ion beam column and a scanning electron microscope column have been combined.

FIG. 26 is a view showing a whole configuration of an apparatus in which a focused ion beam irradiation column and a scanning electron microscope column have been combined. This apparatus is chiefly constituted by a focused ion beam irradiation column 381 having an ion source 351, a lens 352 for focusing an ion beam emitted from the ion source 351, a deflector 353, a deflector 373 for correction, an objective lens 371, and so on; a scanning electron microscope column 382 having an electron gun 357, a lens 359 for focusing an electron beam 358 emitted from the electron gun 357, a deflector 360, a deflector 374 for correction, an objective lens 372, and so on; and a vacuum specimen chamber. In addition, this apparatus has a secondary particle detector 356 for irradiating a specimen 361 with a focused ion beam (FIB) 354 to thereby detect secondary electrons or secondary ions from the specimen, a movable specimen base 362 for mounting the specimen 361 thereon, and a specimen position controller 363 for controlling the position of the specimen base. Further, this apparatus is provided with a probe control unit 365 driven independently of the specimen base 362 so as to move a probe 364 to a specimen piece extraction position, a deposition gas supply unit 367, an image processing unit 366 for analyzing an observed image from the secondary particle detector 356, a central control and display unit 355 for displaying the observed image, and so on.

Next, the operation of this apparatus will be described. First, the specimen 361 is irradiated with ions emitted from the ion source 351 through the lens 352, the deflector 353, the deflector 374 for correction, and the objective lens 371. The FIB 354 is narrowed so as to have about several nanometers to 1 micrometer in diameter on the specimen. When the specimen 361 is irradiated with the FIB 354, constituent atoms in the surface of the specimen are released into a vacuum by a sputtering phenomenon. Thus, processing on a micrometer level or on a submicrometer level can be made by scanning with the FIB 354 by use of the deflector 353. In addition, a deposition film formed by irradiation with the FIB 354 is used for connecting a contact portion at the pointed end of the probe 364 with the specimen, or for fixing an extracted specimen to a specimen holder. In addition, secondary electrons or secondary ions released from the specimen are detected by the secondary particle detector 356 while scanning with the FIB 354. The intensity of the secondary electrons or the secondary ions is converted into luminance of an image so that the specimen 361, the probe 364 and so on can be observed.

In this apparatus, if the ion beam irradiation axis is displaced from the center axis, the ion beam diameter is expanded, and the ion beam shape is degraded. Thus, there is a case where a desired processed shape cannot be produced. In order to maintain high processing performance, it is therefore necessary to minimize the axial displacement of ion beam irradiation before processing. Therefore, description will be made about an example in which the present invention is applied to the alignment of ion beam irradiation in this apparatus. The alignment in this apparatus can be performed in the same manner as that in the scanning electron microscope described previously. That is, first, the objective lens 371 is set into a first state, and the specimen 361 is irradiated with the FIB 354 so that a first image is picked up. The control value of the objective lens 371 is varied to change the objective lens 371 into a second state. Then, a second image is picked up. The image processing unit 366 calculates a positional displacement and a degree of coincidence between the first and second images by use of a displacement analysis method using phase difference of Fourier transform images, judges whether alignment should be carried out or not on the basis of the degree of coincidence, and calculates the control value of the deflector 373 for correction required for making the positional displacement be substantially zero. Further in this apparatus, in the sama manner as that in the scanning electron microscope described previously, it is difficult to measure the physical absolute value of a focal displacement variation caused by the variation of the control value of the objective lens 371, or the physical absolute value of the displacement angle variation caused by the variation of the control value of the deflector 373 for correction. In addition, in order to make the axial displacement be substantially zero, it is not necessary to know the absolute value of the focal displacement variation or the displacement angle variation. Therefore, the positional displacement is converted directly into a variation of the control value of the deflector 373 for correction, and the control value of the deflector 373 for correction is set on the basis of the calculation result. Thus, the axial displacement is corrected.

Incidentally, here, in order to convert the positional displacement into a control value variation of the alignment deflector 373, it is necessary to measure the relationship between the control value variation of the alignment deflector 373 and the positional displacement in advance. This measurement can be performed in the same manner as that in the scanning electron microscope described previously. Therefore, detailed description thereof will be omitted.

Figure 27:
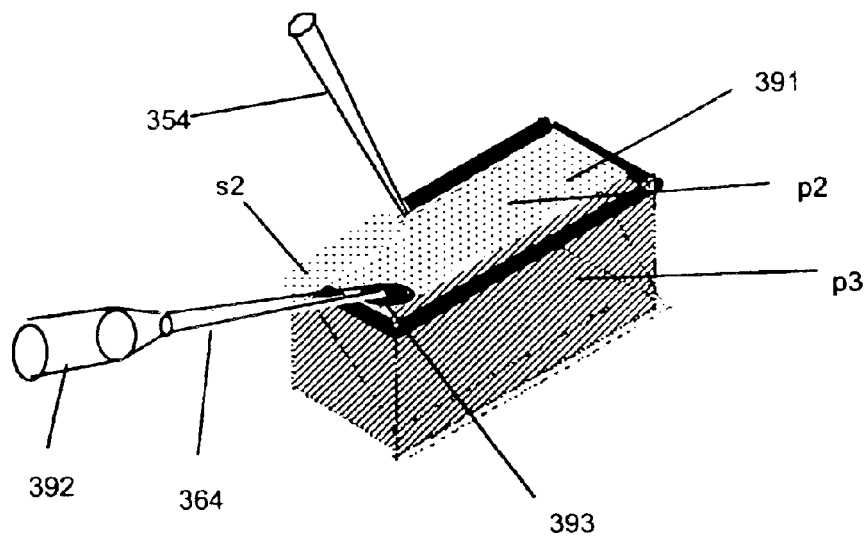
FIG. 27 is a view showing the specimen observation apparatus engaged in making up a specimen.
Figure 28:
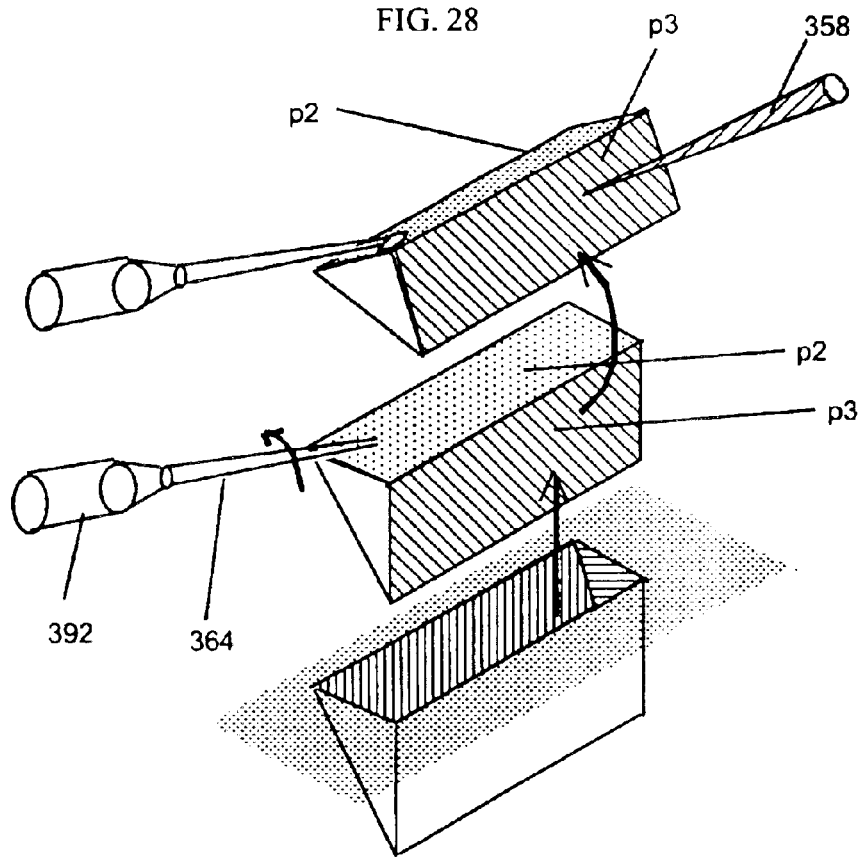
FIG. 28 is a view showing the specimen observation apparatus engaged in extracting a specimen and observing a section thereof.

Next, description will be made about the case where a part of a specimen is extracted as a micro-specimen by use of the FIB and the probe so that a sectional plane of the micro-specimen is observed by an electron microscope function in this apparatus. First, as shown in FIG. 27, the specimen 361 is irradiated with the FIB 354 through the focused ion beam column 381 so that a groove is formed to enclose an observation and analysis position in combination with the rotation of the specimen base. This worked area is about 5 $\mu$m long, about 1 $\mu$m wide, and 3 $\mu$m deep, connecting with the specimen 361 on its one flank. After that, the specimen base 362 is rotated, and slopes of a triangular prism are formed by working with the FIB 354. However, in this state, a micro-specimen 391 and the specimen 361 are connected through a support part s2. Next, after the probe 364 is brought into contact with an end portion of the micro-specimen 391, deposition gas is deposited on a contact point 393 by irradiation with the FIB 354 so that the probe 364 is bonded integrally with the micro-specimen 391. Next, the support part is cut off by the FIB 354 so that the micro-specimen 391 is cut out. The micro-specimen 391 is in a state of being supported by the probe 364. Thus, preparation for extracting a surface and an internal cross-sectional plane for observation and analysis as observation and analysis planes of the micro-specimen 391 is completed. Next, as shown in FIG. 28, the probe control unit 365 is operated to lift the micro-specimen 391 to be high enough to float from the surface of the specimen 361. Then, in order to additionally work the micro-specimen 391 while supporting the micro-specimen 391 by the probe 364, a desired cross-sectional plane p3 for observation is produced by additional working of the micro-specimen 391 in which the irradiation angle of the FIB 354 is established suitably by the rotation operation of the probe. Next, the micro-specimen 391 is rotated, and the specimen holder 392 of the probe control unit 365 is moved so that the electron beam 358 of the scanning electron microscope column 382 enters the cross-sectional plane p3 for observation substantially perpendicularly thereto. After the posture of the micro-specimen 391 is controlled thus, the micro-specimen 391 is made to stand still. As a result, the detection efficiency of secondary electrons in the secondary particle detector 356 comes up to that in the case where the uppermost surface of the wafer is observed. Thus, minute observation and analysis can be performed while the observation conditions of the cross-sectional plane p3 for observation of the micro-specimen 391 are very excellent, and the angle with the plane p2 for observation and analysis and the angle with the cross-sectional plane p3 for observation are adjusted to be desired ones.

When the shape is observed thus, the field of view may be displaced due to specimen drift, stage micromotion error, or the like. In order to correct this displacement of the field of view, positional displacement adjustment by use of the observation of the micro-specimen is executed. First, a first image of the micro-specimen is acquired. Next, a second image of the micro-specimen is acquired. Then, a positional displacement from the recorded first image is analyzed in an analysis method using phase difference of Fourier transform images, and the positional displacement and the degree of coincidence are calculated. If the degree of coincidence is not lower than a lower limit, the displacement of the field of view is corrected by the specimen base or the deflector for correction. When the degree of coincidence is not higher than the lower limit, there is a possibility that the micro-specimen is out of the field of view. Therefore, the image take-in magnification is reduced, and a second image is taken in. Then, the displacement analysis is performed with an image obtained by reducing the recorded first image in the computer. When displacement analysis cannot be performed in the reanalysis, an error message is displayed, and the observation is interrupted. Thus, while the drift of the micro-specimen is corrected, observation and working can be performed on the specimen with high accuracy.

(Embodiment 4)

Generally, when the focus position is varied, the parallax or the best focal point differs in accordance with the degree of the axial displacement of a primary particle beam. For example, when the axis is displaced largely, the primary particle beam cannot be narrowed sufficiently even in a primary focus. Further, the parallax becomes large relatively to the focus variation of the lens. In order to detect the axial displacement in such circumstances, it is necessary to use a comparatively large image area. On the other hand, the detection resolution of the parallax is lowered as the image area is expanded. Therefore, in order to detect the axis with high accuracy, it is necessary to use a small image area. Thus, in order to expand the application range of the axial correction, it is necessary to suitably select an image area for analyzing the focal variation or the parallax in accordance with the degree of the axial displacement. In addition, in an image with a wide field of view, the periphery of the image is shifted with the focal variation of the lens due to the rotation operation of the objective lens even if there is no axial displacement. Therefore, in an image with a wide field of view, if a central part and a peripheral part of the image and the parallax are analyzed separately from one another, erroneous detection of axial displacement is prevented so that the reliability of the detection can be enhanced. That is, in the situation where the axis is aligned, the parallax is large in the periphery of the image with the wide field of view, but small in the center part thereof. On the other hand, if the axis is displaced largely, the parallax in the periphery of the image with the wide field of view becomes substantially equal to that in the central part thereof. If parallax is analyzed in a plurality of image areas by use of this phenomenon, rough adjustment of axial displacement can be performed on the basis of an image with a wide field of view. If the information of the image (sensitivity to detect field view displacement) is sufficient, it is possible to obtain a similar effect in the analysis of parallax in a partial image in the center part.

If the image area is narrowed (the magnification is increased), indistinctness of an image with respect to the focal variation increases. It is therefore necessary to reduce the focal variation on the condition of high magnification. In order to detect axial displacement with high reliability on the condition of a wide range of axial displacement, it is therefore necessary to control the image area for analysis of parallax and the focal variation in a predetermined relation. Such a step of alignment will be described below.

1) Images different in focus are acquired on the condition of a wide field of view (low magnification), and parallax is analyzed in partial images of an image center part and an image peripheral part.
2) Parallax is analyzed from the partial images of a center part and a peripheral part of each image, and if the axial displacement is judged to be not smaller than a predetermined level, the analyzed parallax is fed back to alignment means.
3) Focus correction based on the parallax is performed.
4) Images different in focus are acquired in a narrow field of view (high magnification), and parallax is analyzed by use of a whole image area. If the axial displacement is judged to be not smaller than the predetermined level, the analyzed parallax is fed back to the alignment means.

(Embodiment 5)

In order to acquire an omnifocal image focused over the whole image area in a specimen having irregularities deeper than the focal depth of an optics, it is necessary to measure the irregular state of the specimen in advance, acquire a plurality of images on necessary focal conditions, and combine these images. At this time, detection of focal conditions based on parallax is effective to analyze the irregularity distribution in the whole image area. The image area is divided into a plurality of images (respective divided images may overlap one another), and parallax is analyzed in each of the divided images. Thus, the distribution of focal displacement for places of the image area can be obtained. For example, if parallax analysis of divided images is performed on a semiconductor pattern having a partial structure constant in height or depth, two (for example, surface and hole bottom) focal positions (displacements from a primary focus) are detected in the image as a whole. In this case, if images (two) are acquired in these focal positions respectively, a required omnifocal image can be synthesized from the acquired images. On the other hand, in the case of a biotic specimen or a general material, it is considered that an irregularity level is distributed continuously in the field of view. In this case, different focal displacements are detected from parallax of the divided images respectively. In this case, if a maximum value and a minimum value of the focal displacements are obtained, and an image is acquired while varying the focus at an equal interval so as to cover the whole range of the focal displacements, an omnifocal image can be synthesized. The focal variation at this time may have a step width corresponding to the focal depth of the electron beam optics. This is because the focus can be adjusted within the focal depth even if there are irregularities. In order to perform such processing automatically, it is necessary to perform parallax analysis on each of partial images so as to obtain the distribution of focal displacement. Such a step of synthesizing an image described above will be shown below.

1) Specimen images are acquired at different incident angles respectively by use of a particle beam deflection system (for example, an alignment coil) which can control the incident angle to an objective lens.
2) A plurality (two) of the obtained specimen images are divided into predetermined partial images. The divided images may overlap one another.
3) Parallax is analyzed between partial images corresponding to each other so as to obtain the distribution of parallax in the images.
4) When the distribution of parallax is concentrated in specific places, images are acquired on focal conditions corresponding to the parallax, and an omnifocal image is synthesized from these images.
5) When the parallax is distributed uniformly in a certain range, the range (distribution range of parallax) is obtained, and the following processing is performed.
6) A range of focal positions corresponding to the distribution range of parallax is calculated therefrom.
7) Focal depth of the electron beam optics is calculated from the image acquiring conditions, and a plurality of images are acquired with a focal variation approximately as large as this focal depth.
8) An omnifocal image is synthesized from the plurality of obtained images.

In comparison with a conventional automatic alignment unit, a displacement analysis method using phase difference of Fourier transform images adopted in the present invention can operate even in a lowcontrast field of view. Thus, the applicable specimen range of this displacement analysis method expands a lot. In addition, in this displacement analysis method, the analytic accuracy of an axial displacement $\alpha$ is proportional to the analytic accuracy of a positional displacement D, and the analytic accuracy is in the level of sub-pixel. By adopting such a displacement analysis method, correction with accuracy as high as that by a skilled operator can be carried out in several seconds. In addition, in this displacement analysis method, the degree of coincidence between images is calculated. A lower limit of the degree of coincidence is set for the case where displacement analysis becomes impossible because a specimen is out of a field of view or an image is indistinct. There is provided a flow chart in which alignment is interrupted if the calculated degree of coincidence is not higher than the lower limit. In addition, there may be provided such a flow that when displacement analysis is impossible, the focal variation or the magnification is reduced, and correction is performed again. Thus, the displacement analysis method can also deal with unmanned operation of an apparatus for charged particle beam microscopy.

Axial displacement occurs whenever the extraction conditions of an electron beam from an electron source is varied. Particularly, a field emission type electron gun is easily affected by gas in a mirror body sucked on the pointed end of the electron gun. Thus, such an electron gun often varies the extraction conditions of an electron beam such as extraction voltage or the like. It can be therefore said that it is important to automate alignment. In addition, in the inspection of a semiconductor wafer, a retarding voltage is often varied to optimize the image contrast. An optics is fine-adjusted whenever the retarding voltage is varied in accordance with a pattern. It is therefore important to automate alignment.

As for a focus corrector, focus analysis using parallax is improved to be applicable also to an apparatus in which a deflection fulcrum does not agree with an in-focus plane. Thus, a focus analysis method using parallax is made applicable to any apparatus for charged particle beam microscopy. The focus correction method using parallax is characterized in that the method is low in specimen dependency and can operate at a high speed.

In addition, focus correction using a specimen for adjusting an electron beam optics and focus correction in a real device are distinguished. The focus correction for the specimen for adjusting the electron beam optics is executed in a method based on sharpness or Fourier transform of images. On the other hand, fine adjustment of focus on the real device is executed in a focal displacement correction method according to the present invention. Thus, the operation is made stable and high in speed. In addition, since the focus correction can be executed on the real device, the focus can be adjusted in each position for observation also in a pattern having large irregularities.

Further, an error prevention flow is added using a degree of coincidence between images as a criterion for evaluation. The degree of coincidence is calculated in displacement analysis. Thus, the displacement analysis method can also deal with unmanned operation. In addition, the focal displacement and the degree of coincidence are recorded. In this case, the apparatus adjustment condition before pattern inspection can be checked, or erroneous areas after the pattern inspection can be checked. The recording of the focal displacement can be used also as recording of the irregularities in the wafer surface.

What is claimed is:

1. An apparatus for charged particle beam microscopy comprising:
   a recording unit for recording a first charged particle beam image obtained when a focus of a lens for charged particle beam on a specimen is located in a first position and a second charged particle beam image obtained when said focus is located in a second position;
   a calculation unit for analyzing a positional displacement between said first and second charged particle beam images and a degree of coincidence indicating a degree of resemblance between said first and second charged particle beam images;
   a judgment unit for judging from said degree of coincidence whether said positional displacement can be converted into an axial displacement of a primary charged particle beam relative to said lens for charged particle beam; and
   an alignment unit for correcting said axial displacement of said primary charged particle beam relative to said lens for charged particle beam in response to an alignment signal calculated from said positional displacement,
   wherein said calculation unit calculates the degree of coincidence by calculating a Fourier transformation of said first and second charged particle beam images, calculating a phase difference of said Fourier transformed first and second charged particle beam images, calculating an inverse Fourier transform of said phase difference, and calculating the degree of coincidence defined as an intensity of a δ peak appearing in said inverse Fourier transformed phase difference.

2. An apparatus for charged particle beam microscopy according to claim 1, wherein an image area for analyzing said positional displacement and said degree of coincidence is of one partial image or a plurality of partial images, smaller than a taken-in image area.

3. An apparatus for charged particle beam microscopy comprising:
   a recording unit for recording a first charged particle beam image obtained when a focus of a lens for charged particle beam on a specimen is located in a first position and a second charged particle beam image obtained when said focus is located in a second position;
   a calculation unit for analyzing a positional displacement between said first and second charged particle beam images and a degree of coincidence indicating a degree of resemblance between said first and second charged particle beam images;
   a display unit for said degree of coincidence; and
   a display unit for a control value variation of an alignment system calculated from said positional displacement,
   wherein said calculation unit calculates the degree of coincidence by calculating a Fourier transformation of said first and second charged particle beam images, calculating a phase difference of said Fourier transformed first and second charged particle beam images, calculating an inverse Fourier transform of said phase difference, and calculating the degree of coincidence defined as an intensity of a δ peak appearing in said inverse Fourier transformed phase difference.

4. An apparatus for charged particle beam microscopy comprising:
   a recording unit for recording a first charged particle beam image obtained when a control value of an astigmatism corrector for charged particle beam is a first and a second charged particle beam image obtained when said control value is a second value;
   a calculation unit for analyzing a positional displacement between said first and second charged particle beam images and a degree of coincidence indicating a degree of resemblance between said first and second charged particle beam images;
   a judgment unit for judging from said degree of coincidence whether said positional displacement can be converted into an axial displacement of said astigmatism corrector for charged particle beam; and
   an alignment unit for correcting said axial displacement of said astigmatism corrector for charged particle beam in response to an alignment signal calculated from said positional displacement,
   wherein said calculation unit calculates the degree of coincidence by:
      calculating a Fourier transformation of said first and second charged particle beam images, calculating a phase difference of said Fourier transformed first and second charged particle beam images, calculating an inverse Fourier transform of said phase difference, and calculating the degree of coincidence defined as an intensity of a δ peak appearing in said inverse Fourier transformed phase difference.

5. An apparatus for charged particle beam microscopy comprising:

a recording unit for recording a first charged particle beam image obtained when a control value of an astigmatism corrector for charged particle beam is a first and a second charged particle beam image obtained when said control value is a second value;

a calculation unit for analyzing a positional displacement between said first and second charged particle beam images and a degree of coincidence indicating a degree of resemblance between said first and second charged particle beam images;

a display unit for said degree of coincidence; and a display unit for a control value variation of an alignment system calculated from said positional displacement, wherein said calculation unit calculates the degree of coincidence by calculating a Fourier transformation of said first and second charged particle beam images, calculating a phase difference of said Fourier transformed first and second charged particle beam images, calculating an inverse Fourier transform of said phase difference, and the degree of coincidence defined as calculating an intensity of a δ peak appearing in said inverse Fourier transformed phase difference.

6. An apparatus for charged particle beam microscopy comprising:

a calculation unit for analyzing a first positional displacement between a first charged particle beam image obtained when a focus of a lens for charged particle beam on a specimen is located in a first position and when a control value of a deflector for varying an incident angle of a charged particle beam to said specimen is a first value, and a second charged particle beam image obtained when said control value of said deflector is a second value;

a calculation unit for analyzing a second positional displacement between a third charged particle beam image obtained when said focus of said lens for charged particle beam on said specimen is located in a second position and when said control value of said deflector is a third value, and a fourth charged particle beam image obtained when said control value of said deflector is a fourth value, and for analyzing a degree of coincidence indicating a degree of resemblance between said third and fourth charged particle beam images;

a judgment unit for judging from said degree of coincidence whether a difference between said first positional displacement and said second positional displacement can be converted into a focal displacement of said lens for charged particle beam; and a control unit for correcting said focus of said lens for charged particle beam on said specimen into a first position in response to a correction signal calculated from said difference between said first positional displacement and said second positional displacement, wherein said calculation unit calculates the degree of coincidence by calculating a Fourier transformation of said first and second charged particle beam images, calculating a phase difference of said Fourier transformed first and second charged particle beam images, calculating an inverse Fourier transform of said phase difference, and calculating the degree of coincidence defined as an intensity of a δ peak appearing in said inverse Fourier transformed phase difference.

7. An apparatus for charged particle beam microscopy comprising:

a calculation unit for analyzing a first positional displacement between a first charged particle beam image obtained when a focus of a lens for charged particle beam on a specimen is located in a first position, and a control value of a deflector for varying an incident angle of a charged particle beam to said specimen is a first value and a second charged particle beam image obtained when said control value of said deflector is a second value;

a calculation unit for analyzing a second positional displacement between a third charged particle beam image obtained when said focus of said lens for charged particle beam on said specimen is located in a second position, and said control value of said deflector is a third value and a fourth charged particle beam image obtained when said control value of said deflector is a fourth value, and a degree of coincidence indicating a degree of resemblance between said third and fourth charged particle beam images;

a display unit for said degree of coincidence; and a display unit for a control value variation of said lens for charged particle beam required for correcting said focus of said lens for charged particle beam on said specimen into a first setting, wherein said calculation unit calculates the degree of coincidence by calculating a Fourier transformation of said first and second charged particle beam images, calculating a phase difference of said Fourier transformed first and second charged particle beam images, calculating an inverse Fourier transform of said phase difference, and the degree of coincidence defined as calculating an intensity of a δ peak appearing in said inverse Fourier transformed phase difference.

8. An apparatus for charged particle beam microscopy, comprising:

a charged particle source;

a specimen base for mounting a specimen thereon;

a scanning deflector for scanning and deflecting said specimen with a primary charged particle beam from said charged particle source;

an objective lens for irradiating said specimen with said primary charged particle beam;

an axial deflector disposed between said charged particle source and said objective lens for shifting said primary charged particle beam;

a detector for irradiating said specimen on said specimen base with said primary charged particle beam and detecting a secondary charged particle beam from said specimen;

a memory unit for storing a first image signal and a second image signal detected by said detector synchronously with a signal of said scanning deflector;

an operation unit for performing an operation to obtain a positional displacement between said first image and said second image and a degree of coincidence indicating a degree of resemblance between said images by use of a synthesized image of phase components of Fourier transform images of said first and second images;

a judgment unit for judging whether said degree of coincidence in said operation unit is lower than a predetermined value or not; and a control unit for converting said positional displacement obtained in said operation unit into an alignment signal to be fed back to said axial deflector, and sending said alignment signal thereto, wherein said operation unit determines the degree of coincidence by calculating a Fourier transformation of said first and second charged particle beam images, calculating a phase difference of said Fourier transformed first and second charged particle beam images, calculating an inverse Fourier transform of said phase difference, and calculating the degree of coincidence defined as an intensity of a δ peak appearing in said inverse Fourier transformed phase difference.

9. An inspection method for inspecting a specimen using a charged particle beam, by use of an inspection apparatus having a charged particle source; a specimen base for mounting a specimen thereon; a scanning deflector for scanning and deflecting said specimen with a primary charged particle beam from said charged particle source; an objective lens for irradiating said specimen with said primary charged particle beam; an axial deflector disposed between said charged particle source and said objective lens for shifting said primary charged particle beam; a detector for irradiating said specimen on said specimen base with said primary charged particle beam and detecting a secondary charged particle beam from said specimen; and a memory for storing a first image signal and a second image signal detected by said detector synchronously with a signal of said scanning deflector; said inspection method comprising the step of:

scanning a first area on said specimen with said primary charged particle beam so as to obtain a first image in first conditions of an electron beam optics for obtaining said primary charged particle beam;

obtaining in second conditions different from said first conditions;

obtaining a degree of coincidence image from said first image and said second image by use of a phase limitation method, said degree of coincidence indicating resemblance between said first image and said second; and storing said degree of coincidence obtained in said step of obtaining said degree of coincidence, wherein said degree of coincidence is determined by calculating a Fourier transformation of said first and second images, calculating a phase difference of said Fourier transformed first and second images, calculating an inverse Fourier transform of said phase difference, and calculating the degree of coincidence defined as an intensity of a δ peak appearing in said inverse Fourier transformed phase difference.

10. An apparatus for charged particle beam microscopy according to claim 1, wherein, said first charge particle image and second charged particle image are expressed in a form of S1(n,m) and S2(n+$D_x$, m+$D_y$), where $D_x$ and $D_x$ equals special difference of the second image to the first image, said Fourier transformation of first charged particle image and second charged particle image are expressed in a form of S1(l,k) exp (i$D_x$k+i$D_y$l) and S2(l,k), said phase difference is expressed in a form of P(k,l)=exp (i$D_x$k+i$D_y$l), said inverse Fourier transformation of the phase difference is expressed in a form of P(n,m), and said δ peak is determined in a maximum value of the P(n,m) or by a calculation of a barycentric position.

11. An apparatus for charged particle beam microscopy according to claim 3 wherein, said first charge particle image and second charged particle image are expressed in a form of S1(n,m) and S2(n+$D_x$,m+$D_y$), where $D_x$ and $D_x$ equals special difference of the second image to the first image, said Fourier transformation of first charged particle image and second charged particle image are expressed in a form of S1(l,k) exp (i$D_x$k+i$D_y$l) and S2(l,k), said phase difference is expressed in a form of P(k,l)=exp (i$D_x$k+i$D_y$l), said inverse Fourier transformation of the phase difference is expressed in a form of P(n,m), and said δ peak is determined in a maximum value of the P(n,m) or by a calculation of a barycentric position.

12. An apparatus for charged particle beam microscopy according to claim 4 wherein, said first charge particle image and second charged particle image are expressed in a form of S1(n,m) and S2(n+$D_x$,m+$D_y$), where $D_x$ and $D_x$ equals special difference of the second image to the first image, said Fourier transformation of first charged particle image and second charged particle image are expressed in a form of S1(l,k) exp (i$D_x$k+i$D_y$l) and S2(l,k), said phase difference is expressed in a form of P(k,l)=exp (i$D_x$k+i$D_y$l)

said inverse Fourier transformation of the phase difference is expressed in a form of P(n,m), and said δ peak is determined in a maximum value of the P(n,m) or by a calculation of a barycentric position.

13. An apparatus for charged particle beam microscopy according to claim 5 wherein, said first charge particle image and second charged particle image are expressed in a form of S1(n,m) and S2(n+$D_x$,m+$D_y$), where $D_x$ and $D_x$ equals special difference of the second image to the first image, said Fourier transformation of first charged particle image and second charged particle image are expressed in a form of S1(l,k) exp (i$D_x$k+i$D_y$l) and S2(l,k), said phase difference is expressed in a form of P(k,l)=exp (i$D_x$k+i$D_y$l)

said inverse Fourier transformation of the phase difference is expressed in a form of P(n,m), and said δ peak is determined in a maximum value of the P(n,m) or by a calculation of a barycentric position.

14. An apparatus for charged particle beam microscopy according to claim 6 wherein, said first charge particle image and second charged particle image are expressed in a form of S1(n,m) and S2(n+$D_x$,m+$D_y$), where $D_x$ and $D_x$ equals special difference of the second image to the first image, said Fourier transformation of first charged particle image and second charged particle image are expressed in a form of S1(l,k) exp (i$D_x$k+i$D_y$l) and S2(l,k), said phase difference is expressed in a form of P(k,l)=exp (i$D_x$k+i$D_y$l), said inverse Fourier transformation of the phase difference is expressed in a form of P(n,m), and said δ peak is determined in a maximum value of the P(n,m) or by a calculation of a barycentric position.

15. An apparatus for charged particle beam microscopy according to claim 7 wherein, said first charge particle image and second charged particle image are expressed in a form of S1(n,m) and S2(n+$D_x$,m+$D_y$), where $D_x$ and $D_x$ equals special difference of the second image to the first image, said Fourier transformation of first charged particle image and second charged particle image are expressed in a form of S1(l,k) exp (i$D_x$k+i$D_y$l) and S2(l,k), said phase difference is expressed in a form of P(k,l)=exp (iD$_x$k+iD$_y$l), said inverse Fourier transformation of the phase difference is expressed in a form of P(n,m), and said δ peak is determined in a maximum value of the P(n,m) or by a calculation of a barycentric position.

16. An apparatus for charged particle beam microscopy according to claim 8 wherein, said first charge particle image and second charged particle image are expressed in a form of S1(n,m) and S2(n+D$_x$,m+D$_y$), where D$_x$ and D$_x$ equals special difference of the second image to the first image, said Fourier transformation of first charged particle image and second charged particle image are expressed in a form of S1(l,k) exp (iD$_x$k+iD$_y$l) and S2(l,k), said phase difference is expressed in a form of P(k,l)=exp (iD$_x$k+iD$_y$l), said inverse Fourier transformation of the phase difference is expressed in a form of P(n,m), and said δ peak is determined in a maximum value of the P(n,m) or by a calculation of a barycentric position.

17. An inspection method for inspecting a specimen using a charged particle beam according to claim 9, wherein, said first charged particle image and second charged particle image are expressed in a form of S1(n,m) and S2(n+D$_x$,m+D$_y$), where D$_x$ and D$_x$ equals special difference of the second image to the first image, said Fourier transformation of first charged particle image and second charged particle image are expressed in a form of S1(l,k) exp (iD$_x$k+iD$_y$l) and S2(l,k), said phase difference is expressed in a form of P(k,l)=exp (iD$_x$k+iD$_y$l), said inverse Fourier transformation of the phase difference is expressed in a form of P(n,m), and said δ peak is determined in a maximum value of the P(n,m) or by a calculation of a barycentric position.

* * * * *